(12) United States Patent
Yoshihara et al.

(10) Patent No.: US 8,410,569 B2
(45) Date of Patent: Apr. 2, 2013

(54) SOLID-STATE IMAGING DEVICE AND METHOD FOR PRODUCING THE SAME

(75) Inventors: Ikuo Yoshihara, Kanagawa (JP); Masaya Nagata, Kanagawa (JP); Naoto Sasaki, Kanagawa (JP); Taku Umebayashi, Kanagawa (JP); Hiroshi Takahashi, Kanagawa (JP); Yoichi Otsuka, Kanagawa (JP); Isaya Kitamura, Kumamoto (JP); Tokihisa Kaneguchi, Kumamoto (JP); Keishi Inoue, Kanagawa (JP); Toshihiko Hayashi, Kanagawa (JP); Hiroyasu Matsugai, Kanagawa (JP); Mayoshi Aonuma, Kanagawa (JP); Hiroshi Yoshioka, Kanagawa (JP)

(73) Assignee: Sony Corporation, Tokyo (JP)

( * ) Notice: Subject to any disclaimer, the term of this patent is extended or adjusted under 35 U.S.C. 154(b) by 171 days.

(21) Appl. No.: 12/842,583

(22) Filed: Jul. 23, 2010

(65) Prior Publication Data
US 2011/0024858 A1 Feb. 3, 2011

(30) Foreign Application Priority Data
Jul. 30, 2009 (JP) .................................. 2009-177562

(51) Int. Cl.
*H01L 27/146* (2006.01)

(52) U.S. Cl. ... 257/435; 257/432; 257/434; 257/E27.13; 257/E27.133; 257/E25.032; 257/E31.11; 257/E31.124; 257/E31.127

(58) Field of Classification Search .................. 257/432, 257/434, E27.13, E27.133, E25.032, E31.11, 257/E31.124, E31.127, 435; 438/64, 65
See application file for complete search history.

(56) References Cited

U.S. PATENT DOCUMENTS

| | | | |
|---|---|---|---|
| 7,598,580 B1 * | 10/2009 | Hsin et al. | 257/432 |
| 2008/0237766 A1 * | 10/2008 | Kim | 257/432 |
| 2009/0001495 A1 * | 1/2009 | Weng et al. | 257/433 |
| 2009/0032893 A1 * | 2/2009 | Weng et al. | 257/432 |

FOREIGN PATENT DOCUMENTS

JP 2004-207461 7/2004

* cited by examiner

Primary Examiner — Tom Thomas
Assistant Examiner — Farid Khan
(74) Attorney, Agent, or Firm — SNR Denton US LLP

(57) ABSTRACT

A solid-state imaging device includes a first substrate including a light-sensing portion configured to perform photoelectric conversion of incident light and a wiring portion provided on a light-incident side; an optically transparent second substrate provided on a wiring portion side of the first substrate at a certain distance; a through-hole provided in the first substrate; a through-via provided in the through-hole; a front-surface-side electrode connected to the through-via and provided on a front surface of the first substrate; a back-surface-side electrode connected to the through-via and provided on a back surface of the first substrate; and a stopper electrode provided on the front-surface-side electrode and filling a space between the front-surface-side electrode and the second substrate.

5 Claims, 21 Drawing Sheets

SOLID-STATE IMAGING DEVICE AND METHOD FOR PRODUCING THE SAME

BACKGROUND OF THE INVENTION

1. Field of the Invention

The present invention relates to a solid-state imaging device and a method for producing the same.

2. Description of the Related Art

As shown in FIG. 22, a typical solid-state imaging device 110 in the related art includes a device chip 101 and an optical glass 102 bonded to the device chip 101 with a bonding layer 103 therebetween. An electrode pad 105, a back-surface electrode pad 108, and a through-via 107 connecting the electrode pad 105 to the back-surface electrode pad 108 are provided on the periphery of the device chip 101. Thus, the front surface side of the device chip 101 is electrically connected to the back surface side thereof by forming the through-via 107 penetrating through the device chip 101, thereby reducing the size of the solid-state imaging device 110 (refer to, for example, Japanese Unexamined Patent Application Publication No. 2004-207461).

In the above solid-state imaging device 110, an etching mask composed of a resist is formed on the back surface side of a semiconductor substrate of the device chip 101 by a lithography process, and a through-hole 106 is then formed in the semiconductor substrate by dry etching such as reactive ion etching (RIE). The through-via 107 is formed so as to fill the through-hole 106. In forming the etching mask for forming the through-hole 106, a double-sided alignment method is employed in which a mask pattern is formed on the back surface of the device chip 101 using a surface pattern of a light-sensing portion 104, the electrode pad 105, and the like of the device chip 101 as a reference.

However, such a solid-state imaging device in the related art also has the following problems: In order to form a through-hole by dry etching such as RIE, it is necessary to penetrate through a semiconductor substrate having a thickness of several hundred micrometers. Therefore, it takes a long etching time and the throughput decreases, resulting in an increase in cost. Furthermore, it is very difficult to ensure the controllability and reproducibility of the etching, and a desired yield for obtaining a satisfactory through-hole is difficult to achieve.

Furthermore, in a back-surface irradiation-type image sensor, it is necessary to form an opening that is continuous through a supporting substrate and an adhesive layer. Accordingly, the material of the adhesive layer is limited when existing dry etching such as RIE is performed. In addition, the etching process itself is very complex.

Consequently, for LSI chips other than solid-state imaging devices, a technique in which an energy ray such as a laser beam is applied is used in practice in order to form such a through-hole.

However, in practical application of this technique to an image sensor, it is necessary to increase the thickness of a stopper electrode and to form a nickel (Ni) electrode having a thickness of 10 µm or more as the stopper electrode. Accordingly, after the formation of the stopper electrode having such a large thickness, it becomes difficult to form a color filter layer and microlenses because of uneven application due to the difference in level. On the other hand, as shown in FIG. 23A, when a stopper electrode 33 is formed after the formation of microlenses 73, the microlenses 73 are degraded by a chemical (reducing agent) used in a nickel plating process for forming the stopper electrode 33. Furthermore, as shown in FIG. 23B, when the thickness of the stopper electrode 33 is reduced in order to prevent uneven application, it is difficult to stop laser drilling in the middle of the stopper electrode 33 and the laser drilling tends to penetrate through the stopper electrode 33. As a result, the material of the stopper electrode 33 is scattered, resulting in problems such as a short-circuit in the front-surface-side electrode 21 and light shielding due to adhesion of the scattered material of the stopper electrode 33 to the microlenses 73 and a second substrate 31, which is a glass substrate.

SUMMARY OF THE INVENTION

When energy beam processing such as laser drilling is used for forming a through-hole that penetrates through a substrate of a solid-state imaging device, the laser drilling penetrates through a stopper electrode functioning as a stopper of the energy beam processing, resulting in a problem of scattering and adhesion of the material of the stopper electrode. On the other hand, when a stopper electrode with a large thickness is formed in order to prevent such penetration by energy beam processing, it becomes difficult to form a color filter layer and microlenses in subsequent steps because of the difference in level due to the formation of the stopper electrode.

It is desirable to easily form a color filter layer and microlenses and to form a through-hole, in which a through-via is to be formed, in a substrate of a solid-state imaging device by energy beam processing.

According to an embodiment of the present invention, there is provided a solid-state imaging device including a first substrate including a light-sensing portion configured to perform photoelectric conversion of incident light and a wiring portion provided on a light-incident side; an optically transparent second substrate provided on a wiring portion side of the first substrate at a certain distance; a through-hole provided in the first substrate; a through-via provided in the through-hole; a front-surface-side electrode connected to the through-via and provided on a front surface of the first substrate; a back-surface-side electrode connected to the through-via and provided on a back surface of the first substrate; and a stopper electrode provided on the front-surface-side electrode and filling a space between the front-surface-side electrode and the second substrate.

This solid-state imaging device includes a stopper electrode filling a space between a front-surface-side electrode and a second substrate. Therefore, in forming a through-hole by energy beam processing, even if the through-hole penetrates through the stopper electrode, scattering of the material of the stopper electrode can be prevented by the second substrate.

According to an embodiment of the present invention, there is provided a solid-state imaging device including a first substrate including a light-sensing portion configured to perform photoelectric conversion of incident light and a wiring portion provided on a side opposite a light-incident side; an optically transparent second substrate provided on the light-sensing portion side of the first substrate at a certain distance; a third substrate provided on the wiring portion side of the first substrate with a connecting layer therebetween, a through-hole provided in the third substrate; a through-via provided in the through-hole; a stopper electrode connected to the through-via and provided in the connecting layer; a front-surface-side electrode provided on the stopper electrode; an opening that is located in the first substrate and that extends to the front-surface-side electrode; and a back-surface-side electrode connected to the through-via and provided on a back surface of the third substrate.

This solid-state imaging device includes a stopper electrode. Therefore, when a through-hole is formed by energy beam processing, the energy beam processing can be stopped by the stopper electrode.

According to an embodiment of the present invention, there is provided a method for producing a solid-state imaging device (first production method) including the steps of preparing a first substrate including a light-sensing portion configured to perform photoelectric conversion of incident light and a wiring portion provided on a light-incident side; forming a front-surface-side electrode on the first substrate; preparing an optically transparent second substrate to be provided on a wiring portion side of the first substrate at a certain distance; forming a stopper electrode on a surface of the second substrate, the surface facing the first substrate, the stopper electrode specifying a distance between the first substrate and the second substrate and functioning as a stopper when a through-hole is formed in the first substrate by energy beam processing; bonding the first substrate to the second substrate at the distance specified by the stopper electrode; forming a through-hole extending to the front-surface-side electrode in the first substrate; forming a through-via connected to the front-surface-side electrode in the through-hole; and forming a back-surface-side electrode connected to the through-via on a back surface of the first substrate.

In the method for producing a solid-state imaging device according to an embodiment of the present invention (first production method), a stopper electrode filling a space between a front-surface-side electrode and a second substrate is formed. Therefore, when a though-hole is formed by energy beam processing, the processing can be stopped by the stopper electrode.

According to an embodiment of the present invention, there is provided a method for producing a solid-state imaging device (second production method) including the steps of preparing a first substrate including a light-sensing portion configured to perform photoelectric conversion of incident light and a wiring portion provided on a light-incident side; forming a front-surface-side electrode on the first substrate; forming a color filter layer and a microlens on the light-incident side on the wiring portion of the first substrate, and then forming an optically transparent protective layer covering the microlens; forming an opening on the front-surface-side electrode; forming a stopper electrode in the opening on the front-surface-side electrode, the stopper electrode specifying a distance between the first substrate and a second substrate and functioning as a stopper when a through-hole is formed in the first substrate by energy beam processing; bonding the second substrate having optical transparency to the first substrate at the distance specified by the stopper electrode; forming a through-hole extending to the front-surface-side electrode in the first substrate; forming a through-via connected to the front-surface-side electrode in the through-hole; and forming a back-surface-side electrode connected to the through-via on a back surface of the first substrate.

In the method for producing a solid-state imaging device according to an embodiment of the present invention (second production method), a stopper electrode filling a space between a front-surface-side electrode and a second substrate is formed. Therefore, in forming a through-hole by energy beam processing, even if the through-hole penetrates through the stopper electrode, scattering of the material of the stopper electrode can be prevented by the second substrate.

According to an embodiment of the present invention, there is provided a method for producing a solid-state imaging device (third production method) including the steps of forming a light-sensing portion configured to perform photoelectric conversion of incident light in a first substrate supported on a supporting substrate, and further forming a wiring portion on the first substrate; forming a front-surface-side electrode on the wiring portion; forming a stopper electrode on the front-surface-side electrode, the stopper electrode functioning as a stopper when a through-hole is formed in a third substrate by energy beam processing; bonding the third substrate on a stopper electrode side of the first substrate with a connecting layer therebetween; exposing the first substrate by removing the supporting substrate; forming an opening extending to the front-surface-side electrode in the first substrate; bonding an optically transparent second substrate to the first substrate at a certain distance; forming a through-hole extending to the stopper electrode in the third substrate; forming a through-via connected to the stopper electrode in the through-hole; and forming a back-surface-side electrode connected to the through-via on a back surface of the third substrate.

In the method for producing a solid-state imaging device according to an embodiment of the present invention (third production method), a stopper electrode is formed. Therefore, when a though-hole is formed by energy beam processing, the energy beam processing can be stopped by the stopper electrode.

According to the solid-state imaging device according to an embodiment of the present invention, a color filter layer and microlenses can be easily formed, and a through-hole, in which a through-via is to be formed, can be formed in a substrate of the solid-state imaging device by energy beam processing. Consequently, it is possible to provide a compact solid-state imaging device that can be mass-produced with a high yield at a low cost.

According to the method for producing a solid-state imaging device according to an embodiment of the present invention, a color filter layer and microlenses can be easily formed, and a through-hole, in which a through-via is to be formed, can be formed in a substrate of the solid-state imaging device by energy beam processing. Consequently, it is possible to provide a method for producing a compact solid-state imaging device that can be mass-produced with a high yield at a low cost.

DESCRIPTION OF THE PREFERRED EMBODIMENTS

Embodiments for carrying out the invention (hereinafter referred to as "embodiments") will now be described.

First Embodiment

[First Example of Structure of Solid-State Imaging Device]

A first example of the structure of a solid-state imaging device according to a first embodiment of the present invention will now be described with reference to a schematic cross-sectional view of FIG. 1.

Figure 1:
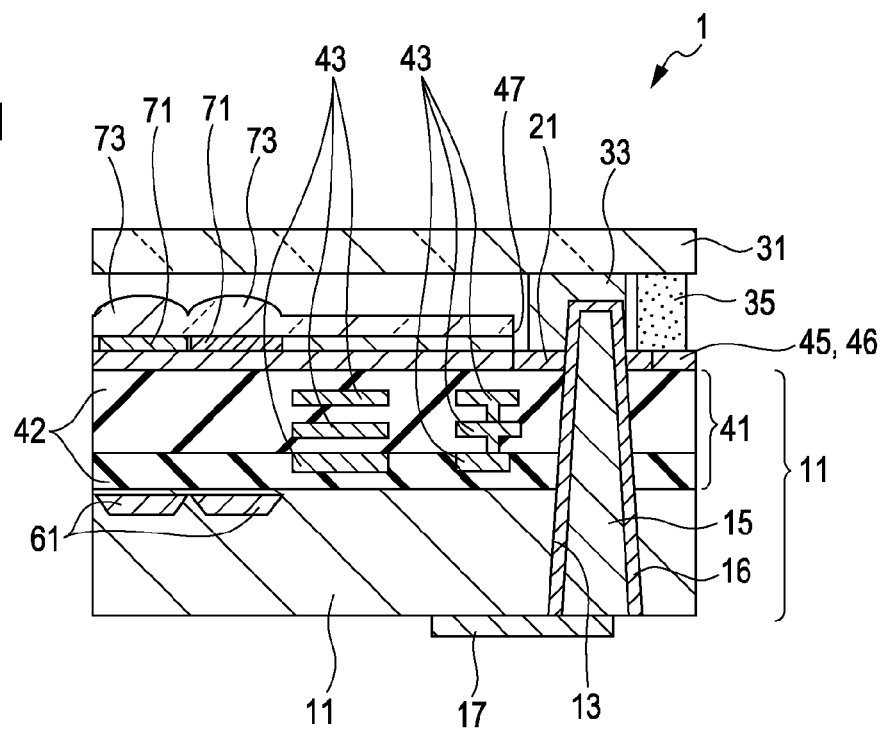
FIG. 1 is a schematic cross-sectional view showing a first example of the structure of a solid-state imaging device according to a first embodiment of the present invention.

As shown in FIG. 1, light-sensing portions 61 are provided in a first substrate 11 which is a semiconductor substrate. The first substrate 11 is, for example, an N-type silicon substrate having a thickness in the range of 500 to 1,000 µm, e.g., 775 µm. A group of in-pixel transistors (not shown) configured to amplify and output electric charges that have been subjected to photoelectric conversion in the light-sensing portions 61, a peripheral circuit portion (not shown) configured to process electrical signals output from the group of in-pixel transistors into an image, and the like are provided in the first substrate 11.

A wiring portion 41 including a plurality of interlayer insulating films 42 and wiring patterns 43 is provided on the first substrate 11. Each of the interlayer insulating films 42 is formed of, for example, a silicon oxide ($SiO_2$) film, and each of the wiring patterns 43 is composed of copper wiring. The surface of the wiring portion 41 is planarized. Hereinafter, a component including the first substrate 11 and the wiring portion 41 is referred to as "first substrate 11".

A front-surface-side electrode 21 is provided on the first substrate 11. This front-surface-side electrode 21 is composed of, for example, aluminum. Although not shown in the figure, aluminum wiring connected to the front-surface-side electrode 21 may also be provided.

An overcoat film 45 covering the front-surface-side electrode 21 and a planarizing film 46 are provided. The overcoat film 45 is formed of, for example, a P—SiN film. The planarizing film 46 is formed of, for example, an organic film.

Furthermore, a color filter layer 71 is provided on the planarizing film 46. This color filter layer 71 is formed so as to have a thickness in the range of 300 to 1,000 nm. Microlenses 73 are provided on the color filter layer 71. These microlenses 73 are formed of, for example, a photosensitive organic film.

Furthermore, an opening 47 is provided on the front-surface-side electrode 21.

An optically transparent second substrate 31 bonded with an adhesive layer 35 is provided on the wiring portion 41 side of the first substrate 11 at a certain distance specified by a stopper electrode 33 bonded onto the front-surface-side electrode 21. This second substrate 31 is, for example, a glass substrate. The stopper electrode 33 is formed by, for example, nickel plating such as nickel-phosphorus (Ni—P) plating or nickel-boron (Ni—B) plating and has a thickness of, for example, 10 µm. The thickness of this stopper electrode 33 is not limited to 10 µm so long as the stopper electrode 33 functions as a stopper when a through-hole 13 is formed in the first substrate 11 by energy beam processing, for example, laser drilling. The thickness of the stopper electrode 33 may be, for example, 5 µm at a certain intensity of the energy beam processing.

The through-hole 13 extending to the front-surface-side electrode 21 is provided in the first substrate 11. A through-via 15 connected to the front-surface-side electrode 21 is provided in the through-hole 13. Furthermore, a back-surface-side electrode 17 connected to the through-via 15 is provided on the back surface of the first substrate 11. The through-via 15 is usually provided in the through-hole 13 with a stacked film of Ti/TiN functioning as a barrier metal 16 therebetween. It is sufficient that the barrier metal 16 is a barrier metal of copper, and the barrier metal 16 may be composed of a tantalum-based material, e.g., a stacked film of Ta/TaN. The through-hole 13 is filled with the through-via 15 formed by copper plating. Alternatively, a copper-plated film may be formed only on the inner wall of the through-hole 13 instead of filling the through-hole 13 with copper plating.

The solid-state imaging device 1 is configured as described above.

According to the solid-state imaging device 1 of the first example, the color filter layer 71 and the microlenses 73 can be easily formed, and the through-hole 13, in which the through-via 15 is to be formed, can be formed in the first substrate 11 of the solid-state imaging device 1 by energy beam processing. Accordingly, it is possible to provide the compact solid-state imaging device 1 that can be mass-produced with a high yield at a low cost.

[Second Example of Structure of Solid-State Imaging Device]

A second example of the structure of the solid-state imaging device according to the first embodiment of the present invention will now be described with reference to a schematic cross-sectional view of FIG. 2.

Figure 2:
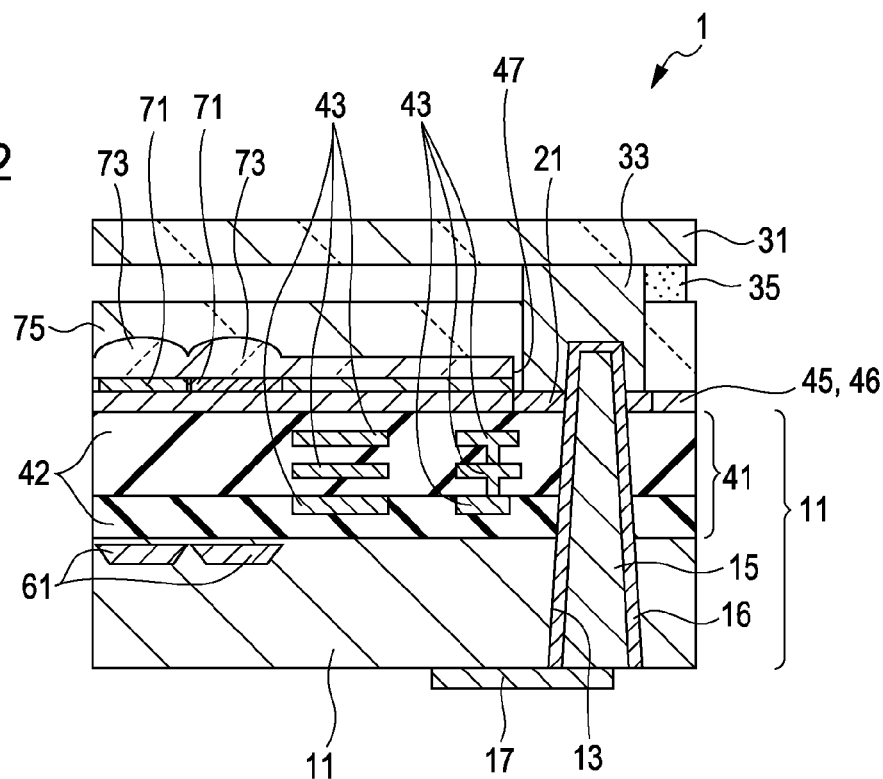
FIG. 2 is a schematic cross-sectional view showing a second example of the structure of a solid-state imaging device according to the first embodiment of the present invention.

As shown in FIG. 2, light-sensing portions 61 are provided in a first substrate 11 which is a semiconductor substrate. The first substrate 11 is, for example, an N-type silicon substrate having a thickness in the range of 500 to 1,000 μm, e.g., 775 μm. A group of in-pixel transistors (not shown) configured to amplify and output electric charges that have been subjected to photoelectric conversion in the light-sensing portions 61, a peripheral circuit portion (not shown) configured to process electrical signals output from the group of in-pixel transistors into an image, and the like are provided in the first substrate 11.

A wiring portion 41 including a plurality of interlayer insulating films 42 and wiring patterns 43 is provided on the first substrate 11. Each of the interlayer insulating films 42 is formed of, for example, a silicon oxide (SiO$_2$) film, and each of the wiring patterns 43 is composed of copper wiring. The surface of the wiring portion 41 is planarized. Hereinafter, a component including the first substrate 11 and the wiring portion 41 is referred to as "first substrate 11".

A front-surface-side electrode 21 is provided on the first substrate 11. This front-surface-side electrode 21 is composed of, for example, aluminum. Although not shown in the figure, aluminum wiring connected to the front-surface-side electrode 21 may also be provided.

An overcoat film 45 covering the front-surface-side electrode 21 and a planarizing film 46 are provided. The overcoat film 45 is formed of, for example, a P—SiN film. The planarizing film 46 is formed of, for example, an organic film.

Furthermore, a color filter layer 71 is provided on the planarizing film 46. This color filter layer 71 is formed so as to have a thickness in the range of 300 to 1,000 nm. Microlenses 73 are provided on the color filter layer 71. These microlenses 73 are formed of, for example, a photosensitive organic film.

An optically transparent protective layer 75 covering the microlenses 73 is provided. A material serving as a low-reflection film on the surface of the microlenses 73 is selected as the material of the protective layer 75. For example, a silicon oxide (SiO$_2$) film, the refractive index of which is decreased by incorporating fluorine, the silicon oxide film being formed by low-temperature chemical vapor deposition (CVD) or sputtering, is used. Spin-on-glass may be used as the silicon oxide film.

Furthermore, an opening 47 is provided on the front-surface-side electrode 21.

An optically transparent second substrate 31 bonded with an adhesive layer 35 is provided on the wiring portion 41 side of the first substrate 11 at a certain distance specified by a stopper electrode 33 bonded onto the front-surface-side electrode 21. This second substrate 31 is, for example, a glass substrate. The stopper electrode 33 is formed by, for example, nickel plating such as nickel-phosphorus (Ni—P) plating or nickel-boron (Ni—B) plating and has a thickness of, for example, 10 μm. The thickness of this stopper electrode 33 is not limited to 10 μm so long as the stopper electrode 33 functions as a stopper when a through-hole 13 is formed in the first substrate 11 by energy beam processing, for example, laser drilling. The thickness of the stopper electrode 33 may be, for example, 5 μm at a certain intensity of the energy beam processing.

The through-hole 13 extending to the front-surface-side electrode 21 is provided in the first substrate 11. A through-via 15 connected to the front-surface-side electrode 21 is provided in the through-hole 13. Furthermore, a back-surface-side electrode 17 connected to the through-via 15 is provided on the back surface of the first substrate 11. The through-via 15 is usually provided in the through-hole 13 with a stacked film of Ti/TiN functioning as a barrier metal 16 therebetween. It is sufficient that the barrier metal 16 is a barrier metal of copper, and the barrier metal 16 may be composed of a tantalum-based material, e.g., a stacked film of Ta/TaN. The through-hole 13 is filled with the through-via 15 formed by copper plating. Alternatively, a copper-plated film may be formed only on the inner wall of the through-hole 13 instead of filling the through-hole 13 with copper plating.

The solid-state imaging device 1 is configured as described above.

According to the solid-state imaging device 1 of the second example, the color filter layer 71 and the microlenses 73 can be easily formed, and the through-hole 13, in which the through-via 15 is to be formed, can be formed in the first substrate 11 of the solid-state imaging device 1 by energy beam processing. Accordingly, it is possible to provide the compact solid-state imaging device 1 that can be mass-produced with a high yield at a low cost.

[Third Example of Structure of Solid-State Imaging Device]

A third example of the structure of a solid-state imaging device according to a first embodiment of the present invention will now be described with reference to a schematic cross-sectional view of FIG. 3.

Figure 3:
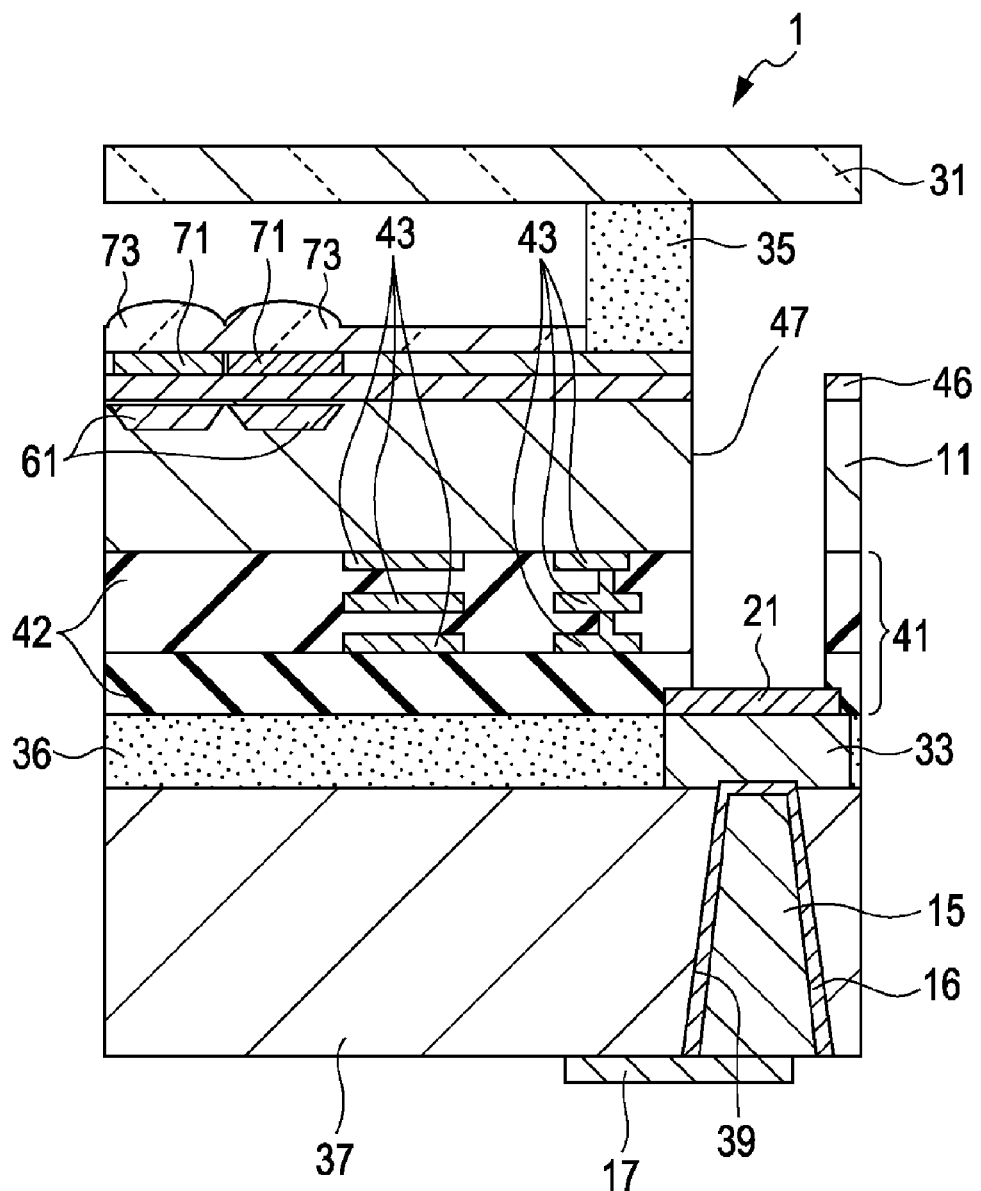
FIG. 3 is a schematic cross-sectional view showing a third example of the structure of a solid-state imaging device according to the first embodiment of the present invention.

As shown in FIG. 3, light-sensing portions 61 are provided in a first substrate 11 which is a semiconductor substrate. The first substrate 11 is, for example, an N-type silicon substrate having a thickness in the range of 500 to 1,000 μm, e.g., 775 μm. A group of in-pixel transistors (not shown) configured to amplify and output electric charges that have been subjected to photoelectric conversion in the light-sensing portions 61, a peripheral circuit portion (not shown) configured to process electrical signals output from the group of in-pixel transistors into an image, and the like are provided in the first substrate 11.

A wiring portion 41 including a plurality of interlayer insulating films 42 and wiring patterns 43 is provided on a side (front surface side) of the first substrate 11 opposite a side (back surface side) on which the light-sensing portions 61 are provided. Each of the interlayer insulating films 42 is formed of, for example, a silicon oxide ($SiO_2$) film, and each of the wiring patterns 43 is composed of copper wiring. The surface of the wiring portion 41 is planarized. Hereinafter, a component including the first substrate 11 and the wiring portion 41 is referred to as "first substrate 11".

A front-surface-side electrode 21 is provided in the wiring portion 41 (on the front surface side) of the first substrate 11. This front-surface-side electrode 21 is composed of, for example, aluminum. Although not shown in the figure, aluminum wiring connected to the front-surface-side electrode 21 may also be provided.

Furthermore, a color filter layer 71 is provided on (the back surface side of) the first substrate 11 with a planarizing film 46 therebetween. The planarizing film 46 is formed of, for example, an organic film. The color filter layer 71 is formed so as to have a thickness in the range of 300 to 1,000 nm. Microlenses 73 are provided on the color filter layer 71. These microlenses 73 are formed of, for example, a photosensitive organic film.

Furthermore, an opening 47 is provided on the front-surface-side electrode 21 to expose the front-surface-side electrode 21.

An optically transparent second substrate 31 bonded with an adhesive layer 35 is provided on the back surface side the first substrate 11, the back surface having the microlenses 73 thereon. This second substrate 31 is, for example, a glass substrate.

A third substrate 37 bonded with an adhesive layer 36 is provided on the front surface side the first substrate 11, the front surface having the wiring portion 41 thereon, at a certain distance specified by a stopper electrode 33 bonded onto the front-surface-side electrode 21. The stopper electrode 33 is formed by, for example, nickel plating such as nickel-phosphorus (Ni—P) plating or nickel-boron (Ni—B) plating and has a thickness of, for example, 10 μm. The thickness of this stopper electrode 33 is not limited to 10 μm so long as the stopper electrode 33 functions as a stopper when a through-hole 39 is formed in the third substrate 37 by energy beam processing, for example, laser drilling. The thickness of the stopper electrode 33 may be, for example, 5 μm at a certain intensity of the energy beam processing.

The through-hole 39 extending to the stopper electrode 33 is provided in the third substrate 37. A through-via 15 connected to the stopper electrode 33 is provided in the through-hole 39. Furthermore, a back-surface-side electrode 17 connected to the through-via 15 is provided on the back surface of the third substrate 37. The through-via 15 is usually provided in the through-hole 39 with a stacked film of Ti/TiN functioning as a barrier metal 16 therebetween. It is sufficient that the barrier metal 16 is a barrier metal of copper, and the barrier metal 16 may be composed of a tantalum-based material, e.g., a stacked film of Ta/TaN. The through-hole 39 is filled with the through-via 15 formed by copper plating. Alternatively, a copper-plated film may be formed only on the inner wall of the through-hole 39 instead of filling the through-hole 39 with copper plating.

The solid-state imaging device 1 is configured as described above.

According to the solid-state imaging device 1 of the third example, the color filter layer 71 and the microlenses 73 can be easily formed, and the through-hole 39, in which the through-via 15 is to be formed, can be formed in the third substrate 37 of the solid-state imaging device 1 by energy beam processing. Accordingly, it is possible to provide the compact solid-state imaging device 1 that can be mass-produced with a high yield at a low cost.

Second Embodiment

[First Example of Method for Producing Solid-State Imaging Device]

A first example of a method for producing a solid-state imaging device according to a second embodiment of the present invention will now be described with reference to FIGS. 4A to 8, which are cross-sectional views showing production steps.

Figure 4A:
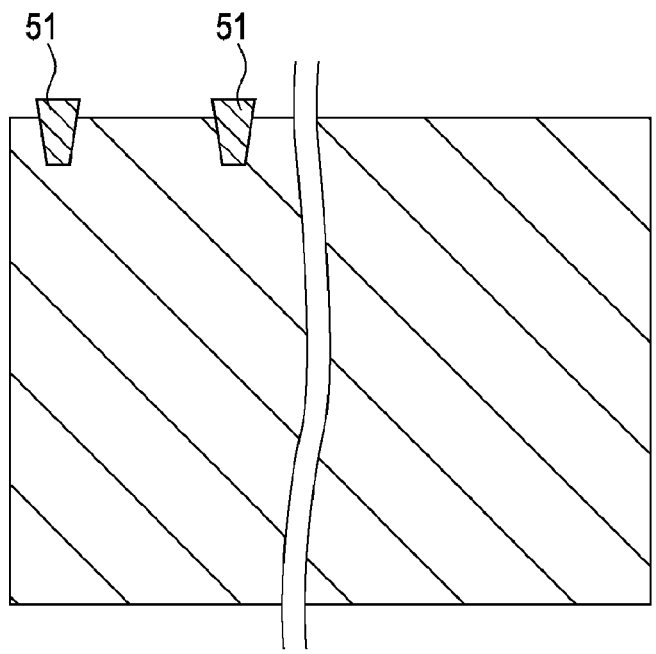
FIGS. 4A and 4B are cross-sectional views each showing a production step of a first example of a method for producing a solid-state imaging device according to a second embodiment of the present invention.

As shown in FIG. 4A, a first substrate 11 formed of a semiconductor substrate is prepared. For example, an N-type silicon substrate having a thickness in the range of 500 to 1,000 μm, e.g., 775 μm is used as the first substrate 11. A surface of the first substrate 11 is oxidized to form a silicon oxide ($SiO_2$) film (not shown) having a thickness in the range of, for example, 10 nm to 30 nm. Subsequently, a silicon nitride ($Si_3N_4$) film (not shown) is formed by reduced-pressure CVD so as to have a thickness in the range of, for example, 80 to 150 nm. Next, grooves each having a depth in the range of 100 to 400 nm are formed in portions of the first substrate 11 where element isolation regions are to be formed. The grooves are filled with silicon oxide by a deposition technique such as high-density plasma CVD. Subsequently, excess silicon oxide is removed by chemical mechanical polishing (CMP) to planarize the surface. In this CMP, the silicon nitride film functions as a polishing stopper. Next, the silicon nitride film is removed by wet etching with hot phosphoric acid to form element isolation regions 51.

Figure 4B:
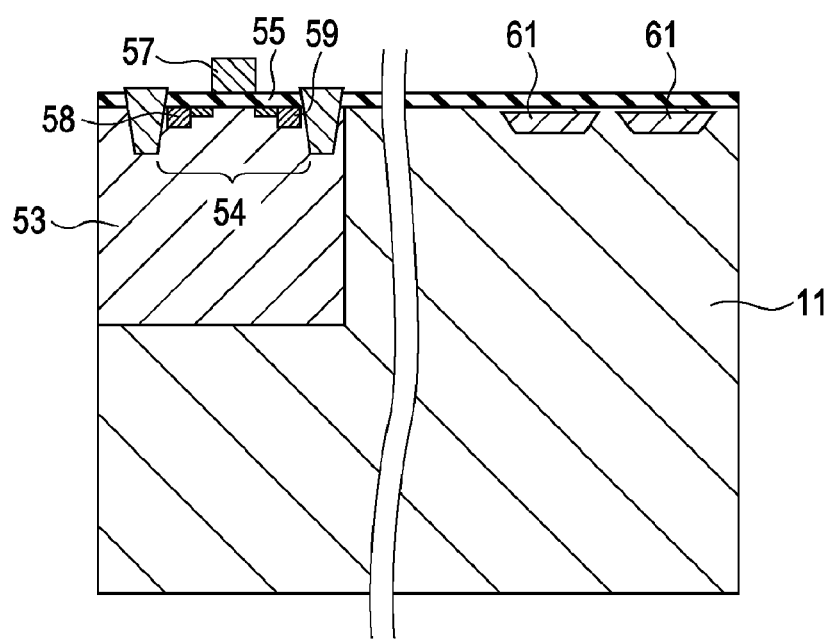

Next, as shown in FIG. 4B, a silicon oxide film is formed on the first substrate 11. This silicon oxide film is formed of, for example, a $SiO_2$ film having a thickness in the range of 5 to 15 nm formed by thermally oxidizing the surface of the first substrate 11 at a temperature in the range of 1,000° C. to 1,100° C. Next, a photoresist pattern (not shown) is formed on the silicon oxide film, and a P-type well region 53 is formed in the first substrate 11 using the photoresist pattern as a mask. Ion implantation for controlling the threshold of a metal-oxide-semiconductor (MOS) transistor is also conducted. Subsequently, the silicon oxide film is removed by wet etching with hydrofluoric acid or the like, and a gate insulating film 55 is then formed on the surface of the first substrate 11. This gate insulating film 55 is formed of a silicon oxide film with a thickness in the range of 5 to 15 nm obtained by thermally oxidizing the surface of the first substrate 11 at a temperature in the range of 1,000° C. to 1,100° C. The gate insulating film 55 may be composed of a material of a gate insulating film used for typical MOS transistors.

Next, a gate electrode layer is formed. This gate electrode layer is formed of, for example, a polysilicon layer with a thickness in the range of 100 to 200 nm formed by CVD. Alternatively, when a metal gate electrode is formed, a metal layer may be formed. An etching process is then conducted using a photoresist pattern as a mask to form a gate electrode 57.

Furthermore, light-sensing portions 61 are formed in the first substrate 11 by ion implantation using a photoresist pattern as a mask. The photoresist pattern is then removed. Subsequently, source/drain regions 58 and 59 including a lightly doped drain (LDD) region and a high-concentration diffusion layer are formed by ion implantation using a photoresist pattern as a mask in a self-aligning manner with respect to the gate electrode 57. A silicide layer (not shown) may be optionally formed on the gate electrode 57 and the source/drain regions 58 and 59. A so-called salicide process, in which a silicide is formed in a self-aligning manner, can be employed for forming this silicide layer. Thus, a MOS transistor 54 is formed.

Figure 5A:
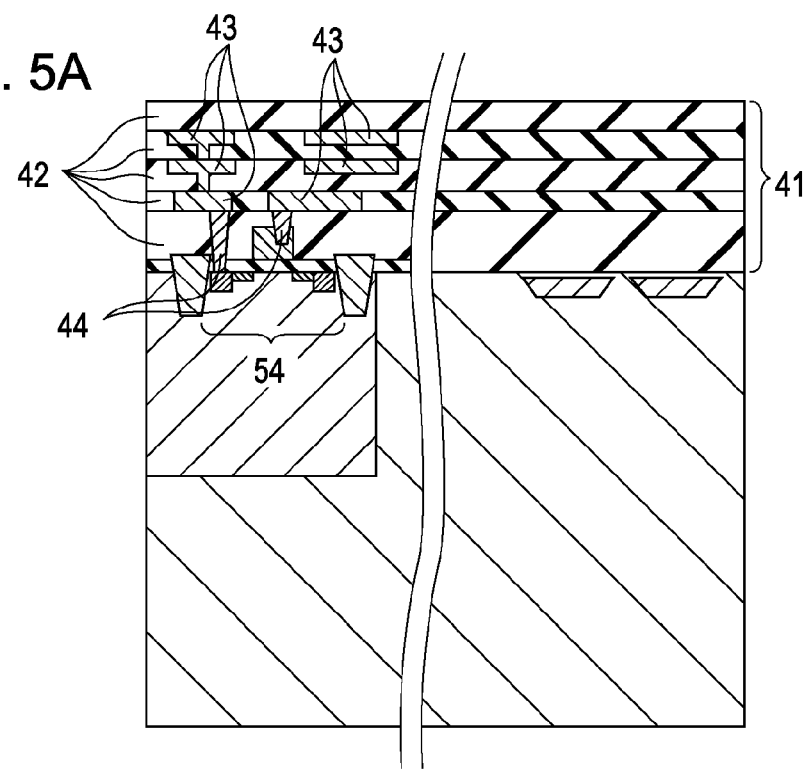
FIGS. 5A and 5B are cross-sectional views each showing a production step of the first example of the method for producing the solid-state imaging device according to the second embodiment of the present invention.

Next, as shown in FIG. 5A, a wiring portion 41 is formed on the first substrate 11. The wiring portion 41 includes a plurality of interlayer insulating films 42 covering the MOS transistor 54, and wiring patterns 43 (including contact electrodes 44) connected to the MOS transistor 54 and the like. For example, an interlayer insulating film 42 covering the gate electrode 57 is formed by depositing a silicon oxide ($SiO_2$) film by, for example, CVD, and the surface of the silicon oxide ($SiO_2$) film is planarized by CMP. Contact electrodes 44 for the source/drain regions 58 and 59 and the gate electrode 57 are formed. The contact electrodes 44 are formed as follows: A barrier metal layer in which a titanium (Ti) layer and a titanium nitride (TiN) layer are stacked is formed in openings serving as electrode-forming regions, and the openings are then each filled with a tungsten layer. Excess portions are then removed by CMP or etch-back. As a result, the contact electrodes 44 formed of a tungsten layer are formed in the openings with the barrier metal layer therebetween. Furthermore, an interlayer insulating film 42 is stacked thereon, openings are formed, and a barrier metal layer and a plated copper wiring layer are formed. A planarizing step by CMP is then performed to form a wiring pattern 43. The formation of an interlayer insulating film 42 and the formation of the wiring pattern 43 described above are repeated to form the wiring portion 41 including a plurality of layers of the wiring pattern 43.

Figure 5B:
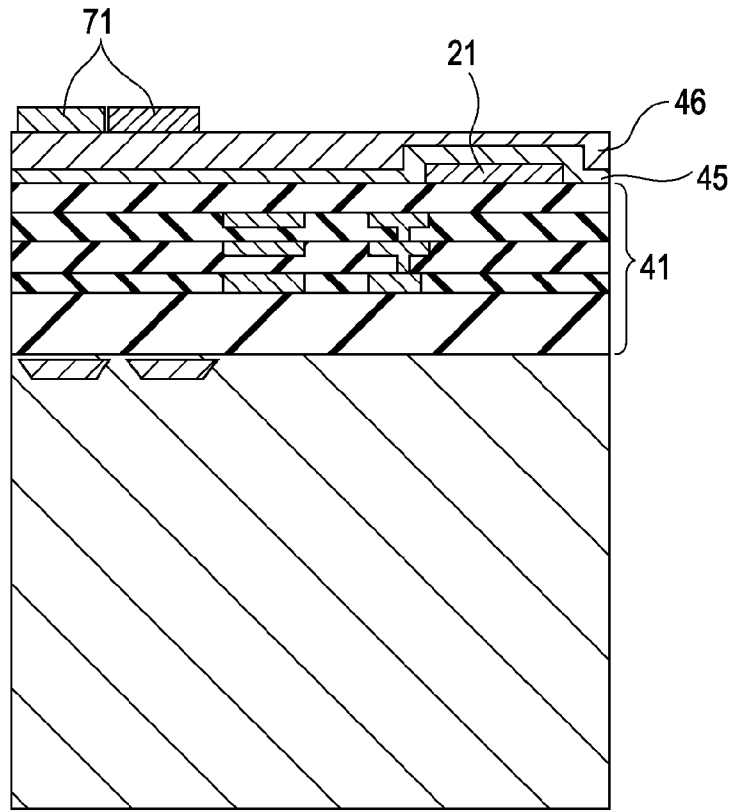

Next, as shown in FIG. 5B, a front-surface-side electrode 21 is formed on the first substrate 11. The front-surface-side electrode 21 is composed of, for example, aluminum. Although not shown in the figure, aluminum wiring connected to the front-surface-side electrode 21 may also be formed in this step. Subsequently, an overcoat film 45 formed of, for example, a P—SiN film is formed by, for example, plasma CVD. A planarizing film 46 is further formed thereon. The planarizing film 46 is formed of, for example, an organic film. Subsequently, a color filter layer 71 is formed on the planarizing film 46 by, for example, steps of application, exposure, development, and the like. In the step of application of the color filter layer 71, the color filter layer 71 can be formed without causing uneven application, which adversely affects imaging characteristics of the solid-state imaging device, because the front-surface-side electrode 21 has a small thickness in the range of 300 to 1,000 nm.

Figure 6A:
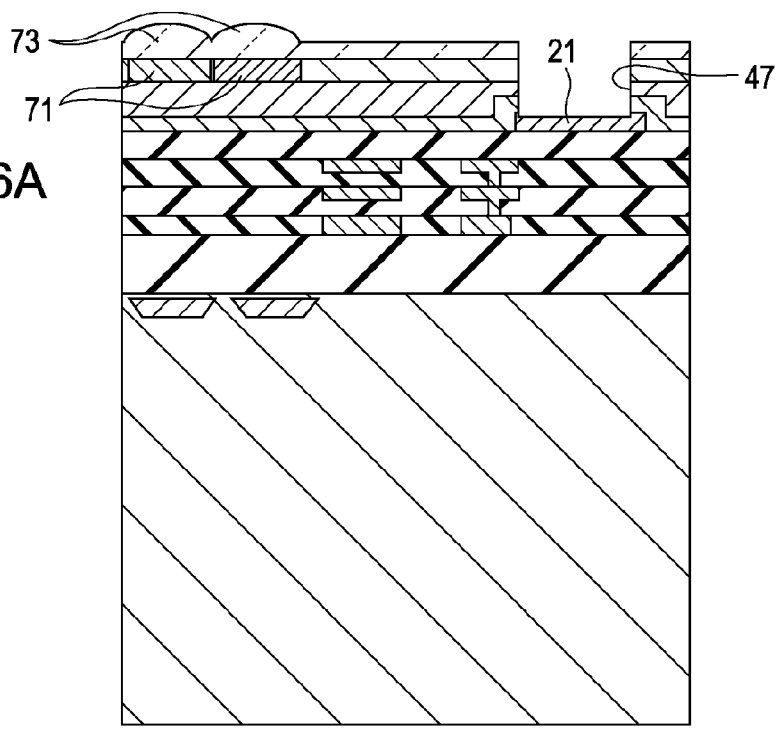
FIGS. 6A and 6B are cross-sectional views each showing a production step of the first example of the method for producing the solid-state imaging device according to the second embodiment of the present invention.

Next, as shown in FIG. 6A, microlenses 73 are formed on the color filter layer 71. The microlenses 73 are formed by forming, for example, a photosensitive organic film, and then forming an opening on the front-surface-side electrode 21. Furthermore, a photoresist pattern for processing a photosensitive lens is formed thereon. In this step, an opening is again formed on the front-surface-side electrode 21, and the photoresist pattern is allowed to flow by a heat treatment so as to have spherical shapes. The spherical shapes are transferred to the photosensitive organic film to be formed into microlenses by entire-surface etching. Thus, the microlenses 73 are formed. In this step, an opening 47 is formed on the front-surface-side electrode 21.

Figure 6B:
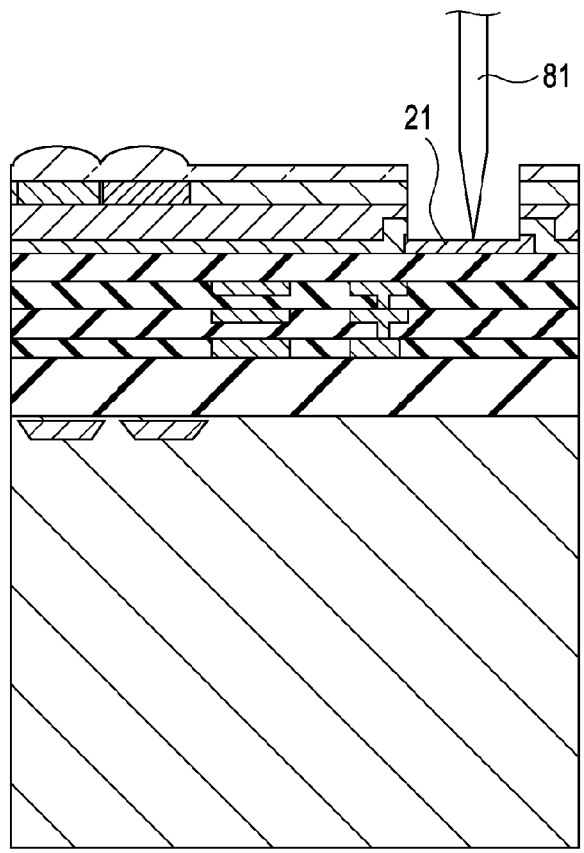

Next, as shown in FIG. 6B, a prober 81 is brought into contact with the front-surface-side electrode 21 to perform a step of measuring imaging characteristics and the like.

Figure 7A:
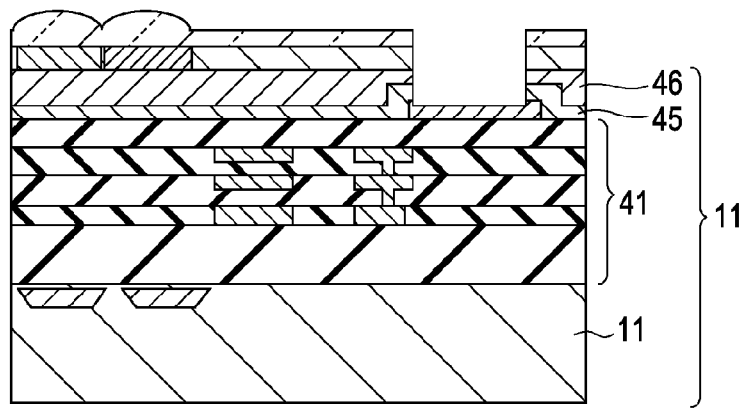
FIGS. 7A to 7C are cross-sectional views each showing a production step of the first example of the method for producing the solid-state imaging device according to the second embodiment of the present invention.

Next, as shown in FIG. 7A, the first substrate 11 is processed so as to have a thickness in the range of, for example, 100 to 400 μm by performing a back-grinding step. Hereinafter, a component including the first substrate 11, the wiring portion 41, the overcoat film 45, and the planarizing film 46 is referred to as "first substrate 11".

Figure 7B:

Next, as shown in FIG. 7B, a second substrate 31 having optical transparency is prepared. The second substrate 31 is provided on the wiring portion 41 side (refer to FIG. 7A) of the first substrate 11 at a certain distance. This second substrate 31 is, for example, a glass substrate. A stopper electrode 33 is formed on a surface of the second substrate 31, the surface facing (the wiring portion 41 side of) the first substrate 11. The stopper electrode 33 specifies the distance between the first substrate 11 and the second substrate 31 and functions as a stopper when a through-hole is formed in the first substrate 11 by energy beam processing. The stopper electrode 33 is formed by, for example, nickel plating such as nickel-phosphorus (Ni—P) plating or nickel-boron (Ni—B) plating. The stopper electrode 33 is formed at a position of the second substrate 31, the position facing the front-surface-side electrode 21 of the first substrate 11. The thickness of the stopper electrode 33 is, for example, 10 μm. The thickness of the stopper electrode 33 is determined so that the stopper electrode 33 satisfactorily functions as a stopper in a subsequent step of energy beam processing, for example, laser drilling.

Figure 7C:
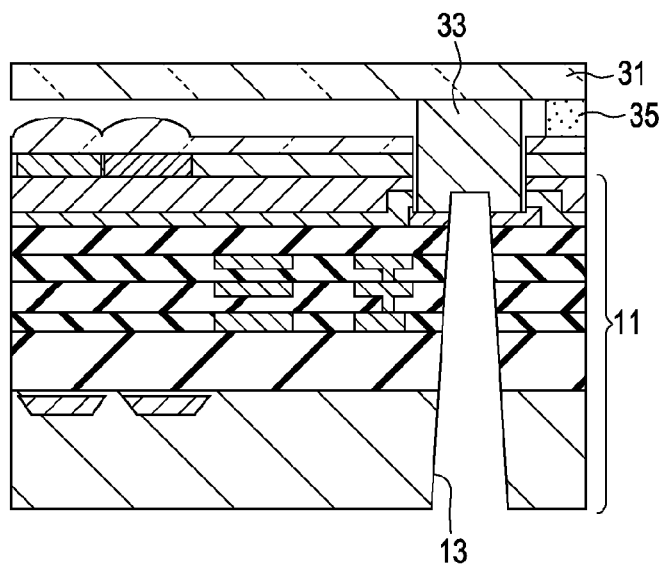

As shown in FIG. 7C, the first substrate 11 is bonded to the second substrate 31 with an adhesive layer 35 therebetween. At this time, the stopper electrode 33 formed on the second substrate 31 is located at a position to be bonded to the front-surface-side electrode 21 of the first substrate 11. In this bonding, the first substrate 11 and the second substrate 31 are bonded to each other at a distance specified by the thickness of the stopper electrode 33.

In this example, the step of bonding the second substrate 31 is performed after the back-grinding step. However, the order of the steps may be reversed. Specifically, the back-grinding step may be performed after the step of bonding the second substrate 31.

Next, a through-hole 13 extending to the front-surface-side electrode 21 is formed in the first substrate 11. Energy beam processing is used in the formation of the through-hole 13. For example, laser drilling is used. For example, a carbon dioxide gas laser processing machine or a laser processing machine using a wavelength of 355 nm of the third harmonic of a YAG laser is used. By using an ablation effect, silicon can be directly vaporized without melting. For example, as for a through-hole 13 having a depth of 100 μm and a diameter of 30 μm, an opening of the through-hole 13 can be formed at a rate of 100,000 holes/min. When it is supposed that the number of openings per chip of a solid-state imaging device is 100, and the number of chips obtained from one wafer with a diameter of 300 mm is 2,000, the opening process of the one wafer is completed within about two minutes. Thus, an operation can be performed in a short time at a low cost, as compared with an existing method for forming openings using exposure and etching.

Figure 8:
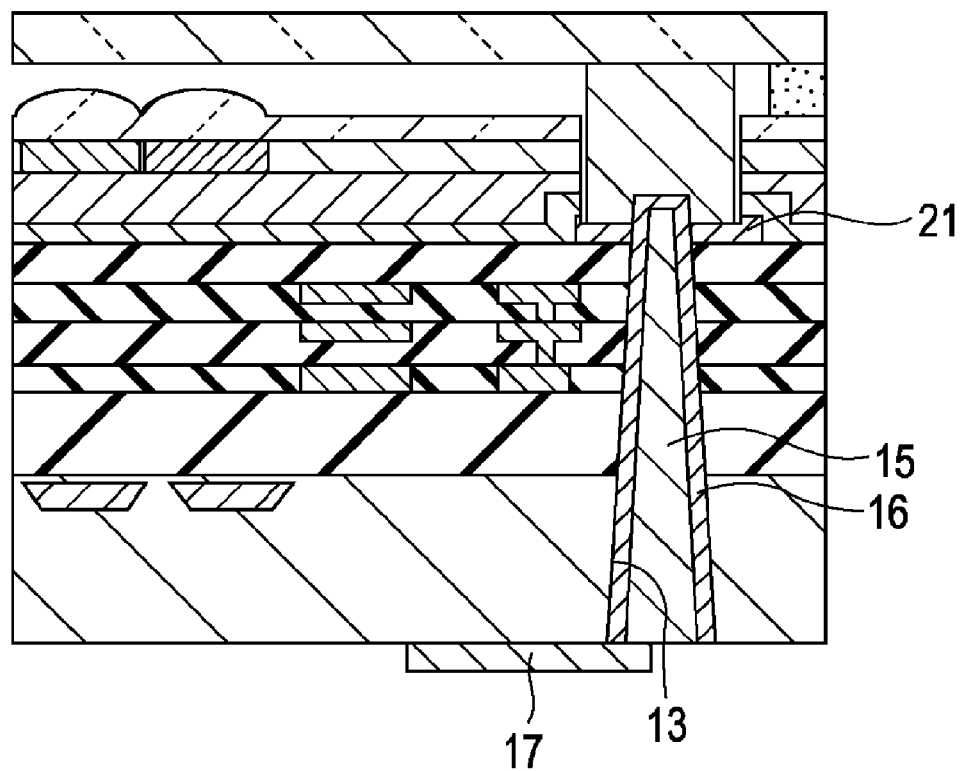
FIG. 8 is a cross-sectional view showing a production step of the first example of the method for producing the solid-state imaging device according to the second embodiment of the present invention.

As shown in FIG. 8, a through-via 15 connected to the front-surface-side electrode 21 is formed in the through-hole 13. Furthermore, a back-surface-side electrode 17 connected to the through-via 15 is formed on the back surface of the first substrate 11. These steps are performed as follows. For example, after the formation of the through-hole 13, a silicon oxide ($SiO_2$) film (not shown) is formed in the through-hole 13 so as to be electrically insulated from the silicon substrate. The silicon oxide film located at the bottom of the through-hole 13 is removed and, a stacked film of Ti/TiN is then formed as a barrier metal 16 by sputtering. Subsequently, a seed layer (electroless copper) for an electrode may be optionally formed in advance on the upper layer of the barrier metal 16. Copper plating is then performed. Note that the copper plating may be formed only on the inner wall of the through-hole 13 instead of filling the through-hole 13 with the copper plating.

The solid-state imaging device is produced as described above.

According to the method for producing a solid-state imaging device of the first example, the color filter layer 71 and the microlenses 73 can be easily formed, and the through-hole 13, in which the through-via 15 is to be formed, can be formed in the first substrate 11 of the solid-state imaging device by energy beam processing. Accordingly, it is possible to provide a method for producing a compact solid-state imaging device that can be mass-produced with a high yield at a low cost.

[Second Example of Method for Producing Solid-State Imaging Device]

A second example of a method for producing a solid-state imaging device according to the second embodiment of the present invention will now be described with reference to FIGS. 9A to 14B, which are cross-sectional views showing production steps.

Figure 9A:
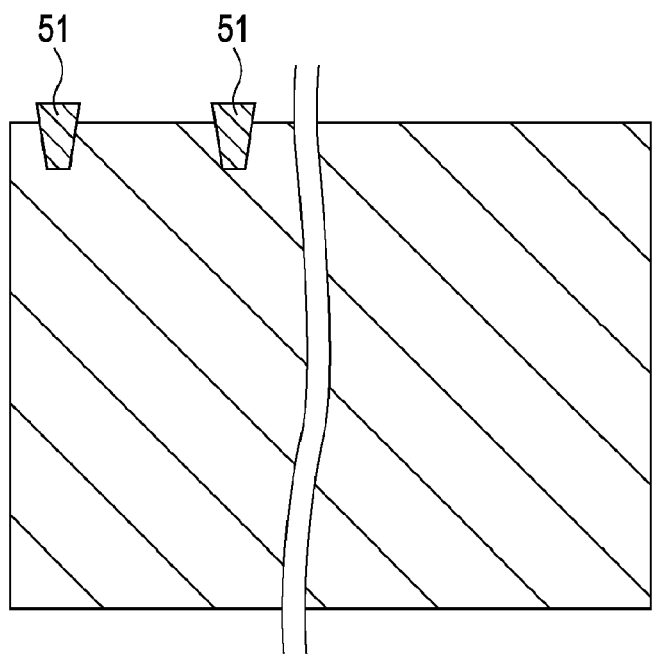
FIGS. 9A and 9B are cross-sectional views each showing a production step of a second example of a method for producing a solid-state imaging device according to the second embodiment of the present invention.

As shown in FIG. 9A, a first substrate 11 formed of a semiconductor substrate is prepared. For example, an N-type silicon substrate having a thickness in the range of 500 to 1,000 μm, e.g., 775 μm is used as the first substrate 11. A surface of the first substrate 11 is oxidized to form a silicon oxide ($SiO_2$) film (not shown) having a thickness in the range of, for example, 10 nm to 30 nm. Subsequently, a silicon nitride ($Si_3N_4$) film (not shown) is formed by reduced-pressure CVD so as to have a thickness in the range of, for example, 80 to 150 nm. Next, grooves each having a depth in the range of 100 to 400 nm are formed in portions of the first substrate 11 where element isolation regions are to be formed. The grooves are filled with silicon oxide by a deposition technique such as high-density plasma CVD. Subsequently, excess silicon oxide is removed by CMP to planarize the surface. In this CMP, the silicon nitride film functions as a polishing stopper. Next, the silicon nitride film is removed by wet etching with hot phosphoric acid to form element isolation regions 51.

Figure 9B:
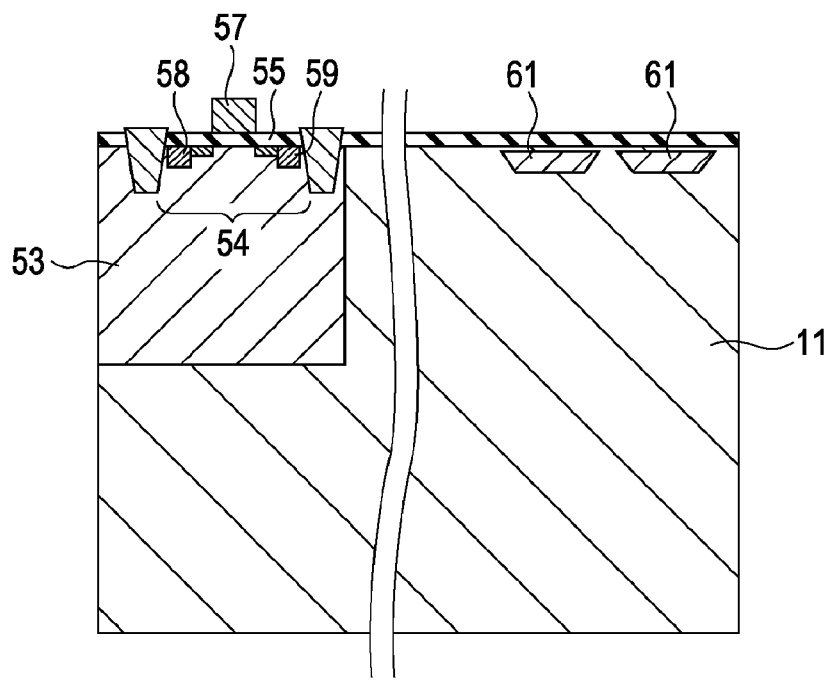

As shown in FIG. 9B, a silicon oxide film is formed on the first substrate 11. This silicon oxide film is formed of, for example, a $SiO_2$ film having a thickness in the range of 5 to 15 nm formed by thermally oxidizing the surface of the first substrate 11 at a temperature in the range of 1,000° C. to 1,100° C. Next, a photoresist pattern (not shown) is formed on the silicon oxide film, and a P-type well region 53 is formed in the first substrate 11 using the photoresist pattern as a mask. Ion implantation for controlling the threshold of a MOS transistor is also conducted. Subsequently, the silicon oxide film is removed by wet etching with hydrofluoric acid or the like, and a gate insulating film 55 is then formed on the surface of the first substrate 11. This gate insulating film 55 is formed of a silicon oxide film with a thickness in the range of 5 to 15 nm formed by thermally oxidizing the surface of the first substrate 11 at a temperature in the range of 1,000° C. to 1,100° C. The gate insulating film 55 may be composed of a material of a gate insulating film used for typical MOS transistors.

Next, a gate electrode layer is formed. This gate electrode layer is formed of, for example, a polysilicon layer with a thickness in the range of 100 to 200 nm formed by CVD. Alternatively, when a metal gate electrode is formed, a metal layer may be formed. An etching process is then conducted using a photoresist pattern as a mask to form a gate electrode 57.

Furthermore, light-sensing portions 61 are formed in the first substrate 11 by ion implantation using a photoresist pattern as a mask. The photoresist pattern is then removed. Subsequently, source/drain regions 58 and 59 including an LDD region and a high-concentration diffusion layer are formed by ion implantation using a photoresist pattern as a mask in a self-aligning manner with respect to the gate electrode 57. A silicide layer (not shown) may be optionally formed on the gate electrode 57 and the source/drain regions 58 and 59. A so-called salicide process, in which a silicide is formed in a self-aligning manner, can be employed for forming this silicide layer. Thus, a MOS transistor 54 is formed.

Figure 10A:
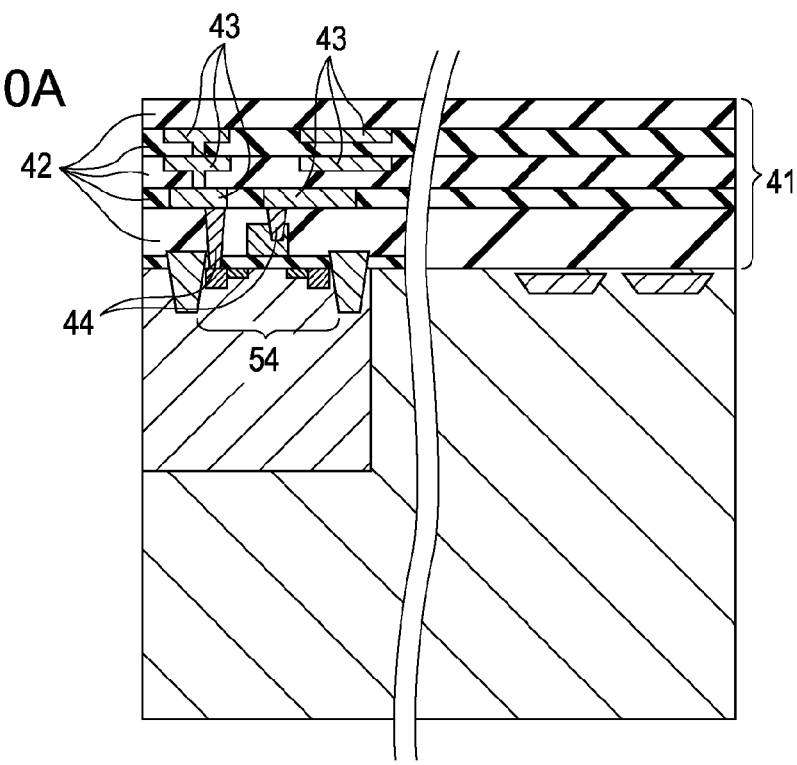
FIGS. 10A and 10B are cross-sectional views each showing a production step of the second example of the method for producing the solid-state imaging device according to the second embodiment of the present invention.

Next, as shown in FIG. 10A, a wiring portion 41 is formed on the first substrate 11. The wiring portion 41 includes a plurality of interlayer insulating films 42 covering the MOS transistor 54, and wiring patterns 43 (including contact electrodes 44) connected to the MOS transistor 54 and the like. For example, an interlayer insulating film 42 covering the gate electrode 57 is formed by depositing a silicon oxide ($SiO_2$) film by, for example, CVD, and the surface of the silicon oxide ($SiO_2$) film is planarized by CMP. Contact electrodes 44 for the source/drain regions 58 and 59 and the gate electrode 57 are formed. The contact electrodes 44 are formed as follows: A barrier metal layer in which a titanium (Ti) layer and a titanium nitride (TiN) layer are stacked is formed in openings serving as electrode-forming regions, and the openings are then each filled with a tungsten layer. Excess portions are then removed by CMP or etch-back. As a result, the contact electrodes 44 formed of a tungsten layer are formed in the openings with the barrier metal layer therebetween. Furthermore, an interlayer insulating film 42 is stacked thereon, openings are formed, and a barrier metal layer and a plated copper wiring layer are formed. A planarizing step by CMP is then performed to form a wiring pattern 43. The formation of an interlayer insulating film 42 and the formation of the wiring pattern 43 described above are repeated to form the wiring portion 41 including a plurality of layers of the wiring pattern 43.

Figure 10B:
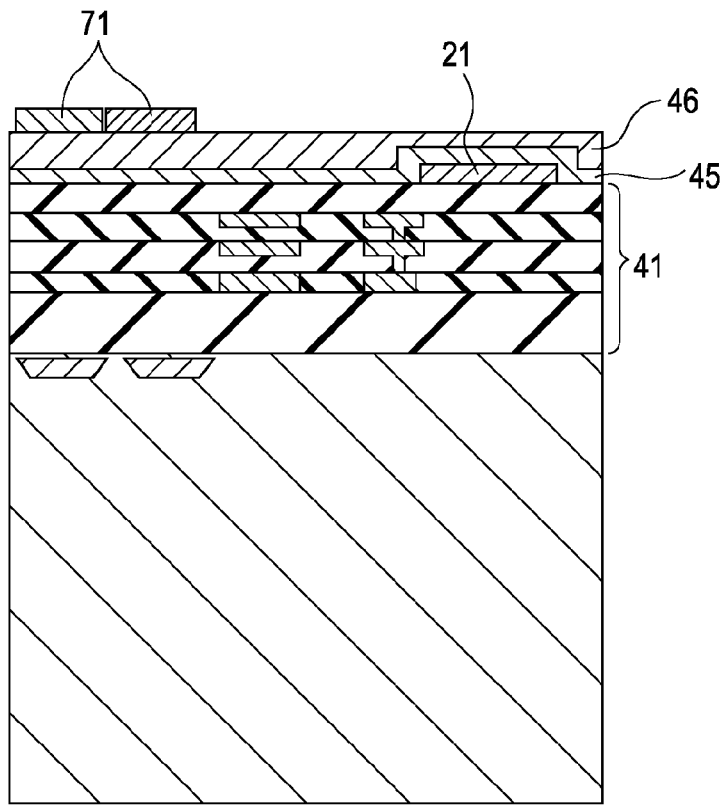

Next, as shown in FIG. 10B, a front-surface-side electrode 21 is formed on the first substrate 11. The front-surface-side electrode 21 is composed of, for example, aluminum. Although not shown in the figure, aluminum wiring connected to the front-surface-side electrode 21 may also be formed in this step. Subsequently, an overcoat film 45 formed of, for example, a P—SiN film is formed by, for example, plasma CVD. A planarizing film 46 is further formed thereon. The planarizing film 46 is formed of, for example, an organic film. Subsequently, a color filter layer 71 is formed on the planarizing film 46 by, for example, steps of application, exposure, development, and the like. In the step of application of the color filter layer 71, the color filter layer 71 can be formed without causing uneven application, which adversely affects imaging characteristics of the solid-state imaging device, because the front-surface-side electrode 21 has a small thickness in the range of 300 to 1,000 nm.

Figure 11A:
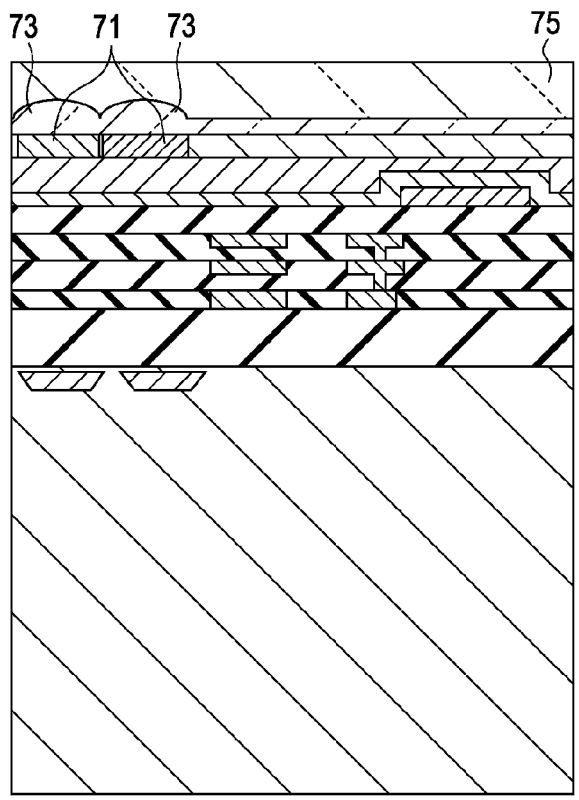
FIGS. 11A and 11B are cross-sectional views each showing a production step of the second example of the method for producing the solid-state imaging device according to the second embodiment of the present invention.

Next, as shown in FIG. 11A, microlenses 73 are formed on the color filter layer 71. The method for forming the microlenses 73 is the same as that used in the first example. An optically transparent protective layer 75 covering the microlenses 73 is formed. A material serving as a low-reflection film on the surface of the microlenses 73 is selected as the material of the protective layer 75. For example, a silicon oxide ($SiO_2$) film, the refractive index of which is decreased by incorporating fluorine, the silicon oxide film being formed by low-temperature CVD or sputtering, is used. Spin-onglass may be used as the silicon oxide film. The surface of the protective layer 75 may then be planarized by etch-back, CMP, or the like.

Figure 11B:
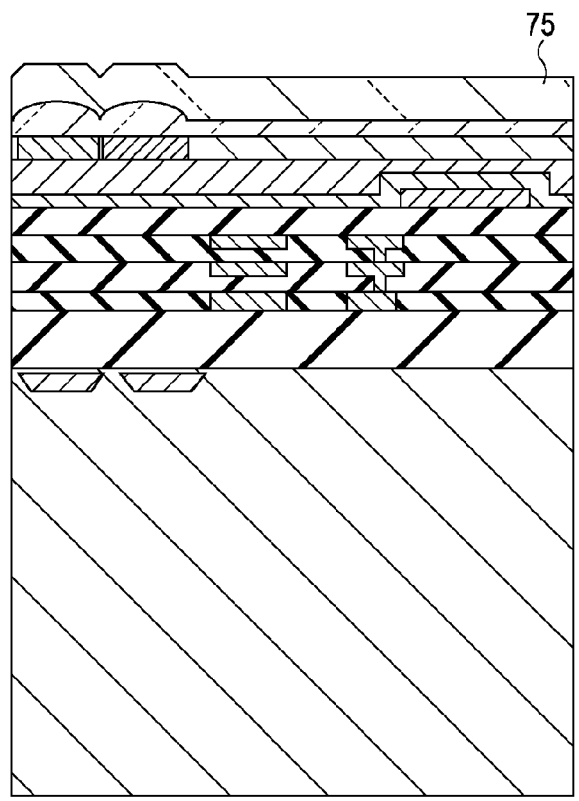

Alternatively, as shown in FIG. 11B, the protective layer 75 formed of a low-reflection film may be formed without performing the planarizing step described above.

Figure 12A:
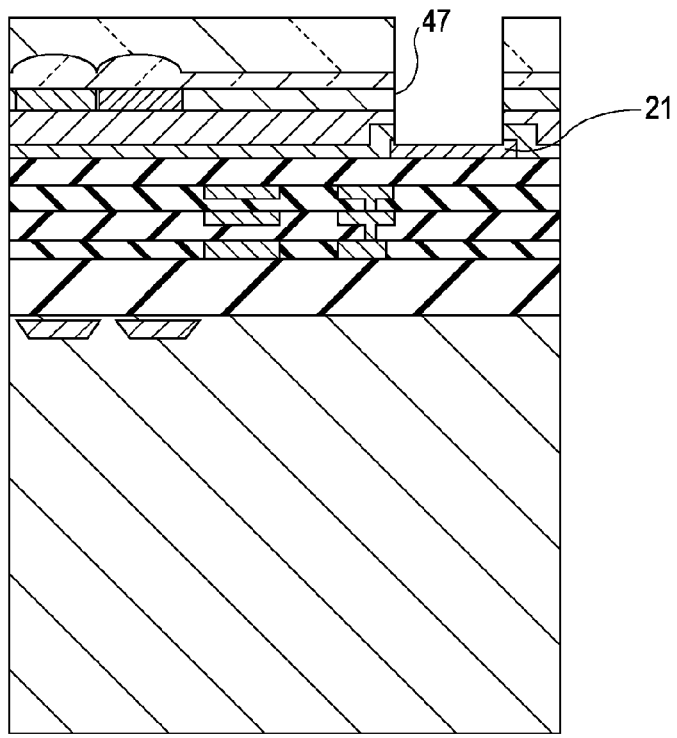
FIGS. 12A and 12B are cross-sectional views each showing a production step of the second example of the method for producing the solid-state imaging device according to the second embodiment of the present invention.

Next, as shown in FIG. 12A, an opening 47 is formed on the front-surface-side electrode 21. This opening 47 is formed by, for example, an etching process using a photoresist mask.

Figure 12B:
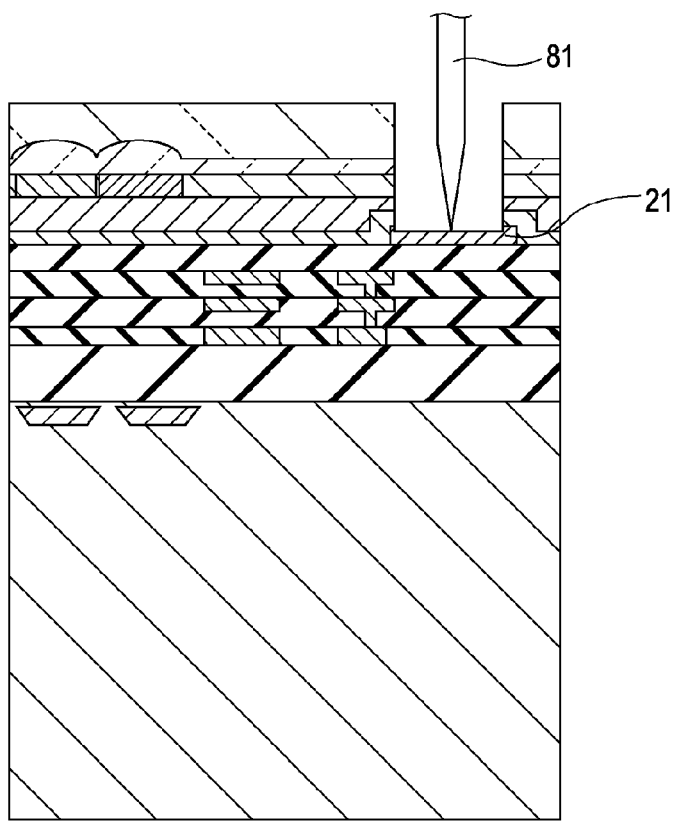

Next, as shown in FIG. 12B, a prober 81 is brought into contact with the front-surface-side electrode 21 to perform a step of measuring imaging characteristics and the like.

Figure 13A:
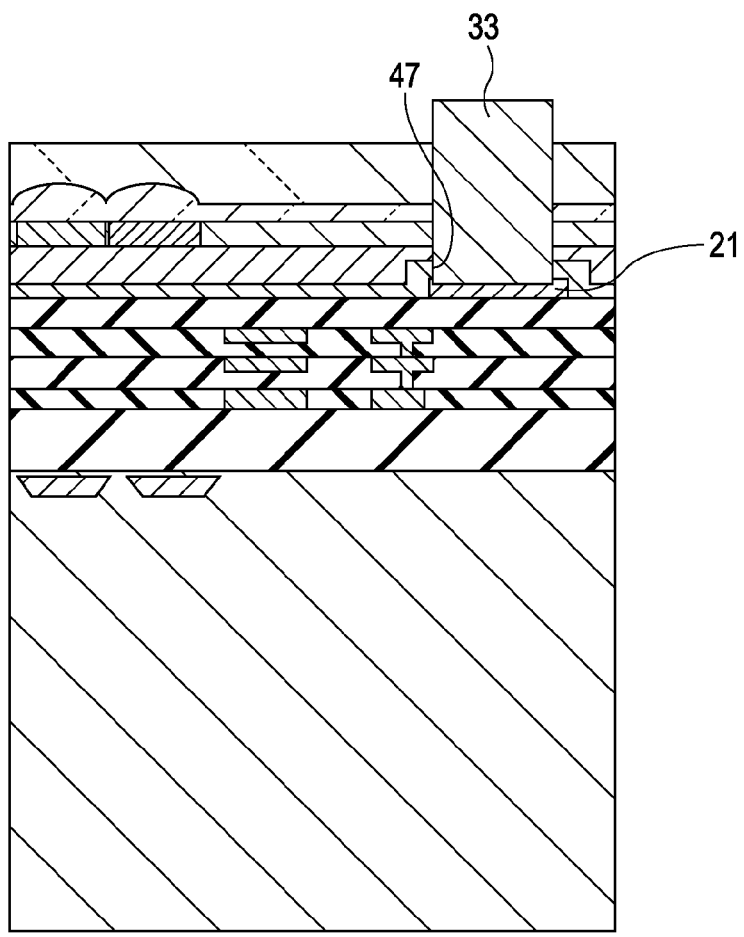
FIGS. 13A and 13B are cross-sectional views each showing a production step of the second example of the method for producing the solid-state imaging device according to the second embodiment of the present invention.

Next, as shown in FIG. 13A, a stopper electrode 33 is formed in the opening 47 on the front-surface-side electrode 21. The stopper electrode 33 specifies the distance between the first substrate 11 and a second substrate 31 and functions as a stopper when a through-hole is formed in the first substrate 11 by energy beam processing. The stopper electrode 33 is formed in the opening 47 provided on the front-surface-side electrode 21 by, for example, nickel plating such as nickel-phosphorus (Ni—P) plating or nickel-boron (Ni—B) plating. In performing this plating step, since the microlenses 73 formed of an organic film are covered with the protective layer 75 composed of an inorganic material, the microlenses 73 are not degraded even after the plating step. The stopper electrode 33 is formed at a position of the second substrate 31, the position facing the front-surface-side electrode 21 of the first substrate 11. The thickness of the stopper electrode 33 is, for example, 10 μm. The thickness of the stopper electrode 33 is determined so that the stopper electrode 33 satisfactorily functions as a stopper in a subsequent step of energy beam processing, for example, laser drilling. In addition, since the stopper electrode 33 is formed after the formation of the color filter layer 71 and the microlenses 73, uneven application does not occur when the materials of the color filter layer 71 and the microlenses 73 are applied by spin-coating.

Figure 13B:
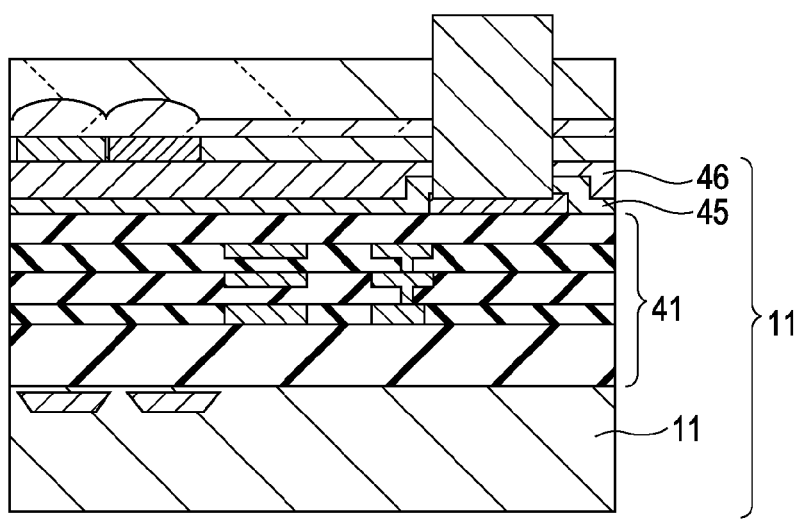

Next, as shown in FIG. 13B, the first substrate 11 is processed so as to have a thickness in the range of, for example, 100 to 400 μm by performing a back-grinding step. Hereinafter, a component including the first substrate 11, the wiring portion 41, the overcoat film 45, and the planarizing film 46 is referred to as "first substrate 11".

Figure 14A:
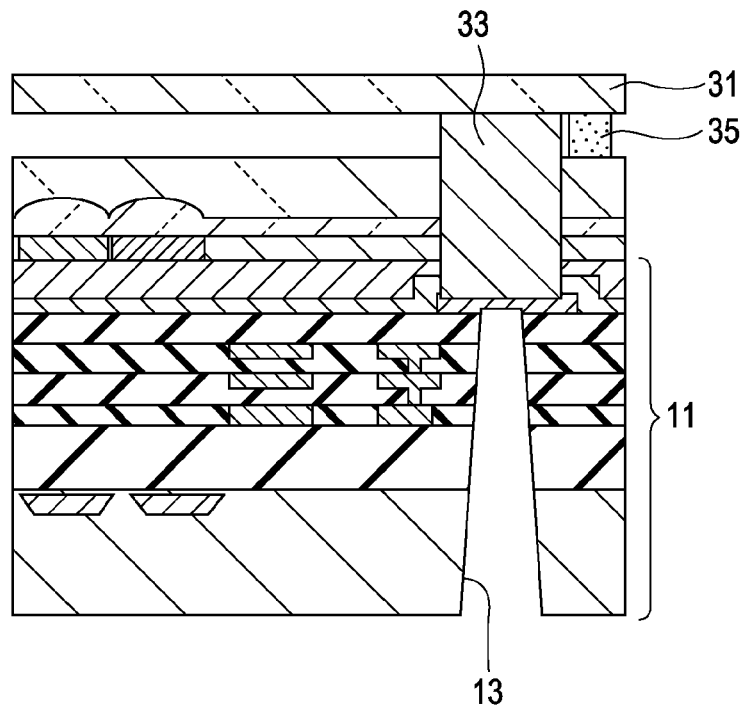
FIGS. 14A and 14B are cross-sectional views each showing a production step of the second example of the method for producing the solid-state imaging device according to the second embodiment of the present invention.

As shown in FIG. 14A, a second substrate 31 having optical transparency is prepared. The second substrate 31 is provided on the wiring portion 41 side (refer to FIG. 13B) of the first substrate 11 at a certain distance. This second substrate 31 is, for example, a glass substrate. The first substrate 11 is bonded to the second substrate 31 with an adhesive layer 35 therebetween. In this bonding, the first substrate 11 and the second substrate 31 are bonded to each other at a distance specified by the thickness of the stopper electrode 33.

In this example, the step of bonding the second substrate 31 is performed after the back-grinding step. However, the order of the steps may be reversed. Specifically, the back-grinding step may be performed after the step of bonding the second substrate 31.

Next, a through-hole 13 extending to the front-surface-side electrode 21 is formed in the first substrate 11. Energy beam processing is used in the formation of the through-hole 13. For example, laser drilling is used. For example, a carbon dioxide gas laser processing machine or a laser processing machine using a wavelength of 355 nm of the third harmonic of a YAG laser is used. By using an ablation effect, silicon can be directly vaporized without melting. For example, as for a through-hole 13 having a depth of 100 μm and a diameter of 30 μm, an opening of the through-hole 13 can be formed at a rate of 100,000 holes/min. When it is supposed that the number of openings per chip of a solid-state imaging device is 100, and the number of chips obtained from one wafer with a diameter of 300 mm is 2,000, the opening process of the one wafer is completed within about two minutes. Thus, an operation can be performed in a short time at a low cost, as compared with an existing method for forming openings using exposure and etching.

Figure 14B:
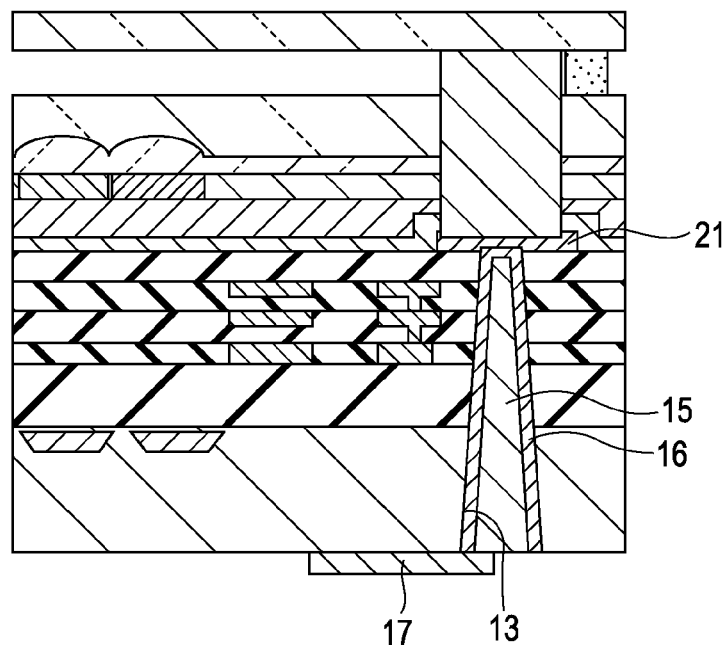

As shown in FIG. 14B, a through-via 15 connected to the front-surface-side electrode 21 is formed in the through-hole 13. Furthermore, a back-surface-side electrode 17 connected to the through-via 15 is formed on the back surface of the first substrate 11. These steps are performed as follows. For example, after the formation of the through-hole 13, a silicon oxide ($SiO_2$) film (not shown) is formed in the through-hole 13 so as to be electrically insulated from the silicon substrate. The silicon oxide film located at the bottom of the through-hole 13 is removed, and a stacked film of Ti/TiN is then formed as a barrier metal 16 by sputtering. Subsequently, a seed layer (electroless copper) for an electrode may be optionally formed in advance on the upper layer of the barrier metal 16. Copper plating is then performed. Note that the copper plating may be formed only on the inner wall of the through-hole 13 instead of filling the through-hole 13 with the copper plating.

The solid-state imaging device is produced as described above.

According to the method for producing a solid-state imaging device of the second example, the color filter layer 71 and the microlenses 73 can be easily formed, and the through-hole 13, in which the through-via 15 is to be formed, can be formed in the first substrate 11 of the solid-state imaging device by energy beam processing. Accordingly, it is possible to provide a method for producing a compact solid-state imaging device that can be mass-produced with a high yield at a low cost.

[Third Example of Method for Producing Solid-State Imaging Device]

A third example of a method for producing a solid-state imaging device according to the second embodiment of the present invention will now be described with reference to FIGS. 15A to 21, which are cross-sectional views showing production steps.

Figure 15A:
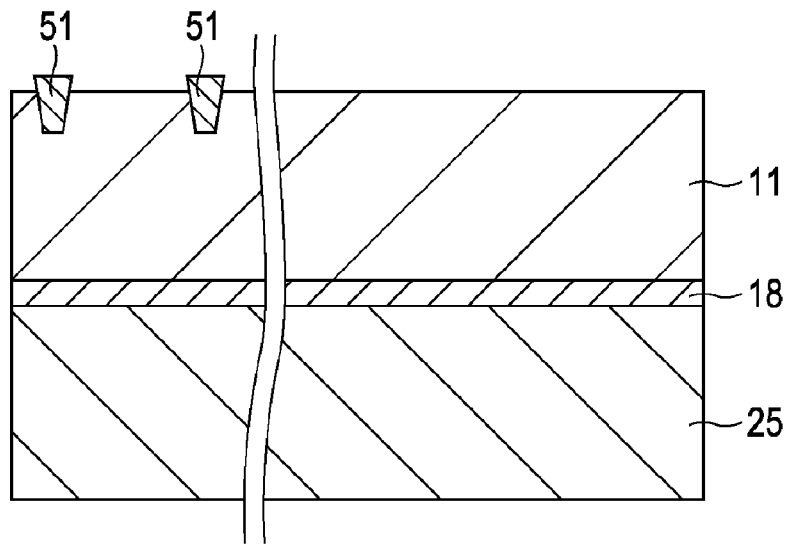
FIGS. 15A and 15B are cross-sectional views each showing a production step of a third example of a method for producing a solid-state imaging device according to the second embodiment of the present invention.

As shown in FIG. 15A, a first substrate 11 formed of a semiconductor substrate supported by a supporting substrate 25 is prepared. For example, a stopper layer 18 having a thickness of 20 to 100 nm may be formed in the first substrate 11 so that one part of the substrate serves as the supporting substrate 25 and the other part of the substrate serves as the first substrate 11. For example, an N-type silicon substrate having a thickness in the range of 500 to 1,000 μm, e.g., 775 μm is used as the first substrate 11. The stopper layer 18 is formed of a so-called buried oxide (BOX) layer in which oxygen or hydrogen is ion-implanted, or a diffusion layer in which an impurity such as boron (B) is ion-implanted at a concentration of $1\times10^{13}$ to $1\times10^{16}/cm^2$. Next, a surface of the first substrate 11 is oxidized to form a silicon oxide ($SiO_2$) film (not shown) having a thickness in the range of, for example, 10 nm to 30 nm. Subsequently, a silicon nitride ($Si_3N_4$) film (not shown) is formed by reduced-pressure CVD so as to have a thickness in the range of, for example, 80 to 150 nm. Next, grooves each having a depth in the range of 100 to 400 nm are formed in portions of the first substrate 11 where element isolation regions are to be formed. The grooves are filled with silicon oxide by a deposition technique such as high-density plasma CVD. Subsequently, excess silicon oxide is removed by CMP to planarize the surface. In this CMP, the silicon nitride film functions as a polishing stopper.

Next, the silicon nitride film is removed by wet etching with hot phosphoric acid to form element isolation regions 51.

Figure 15B:
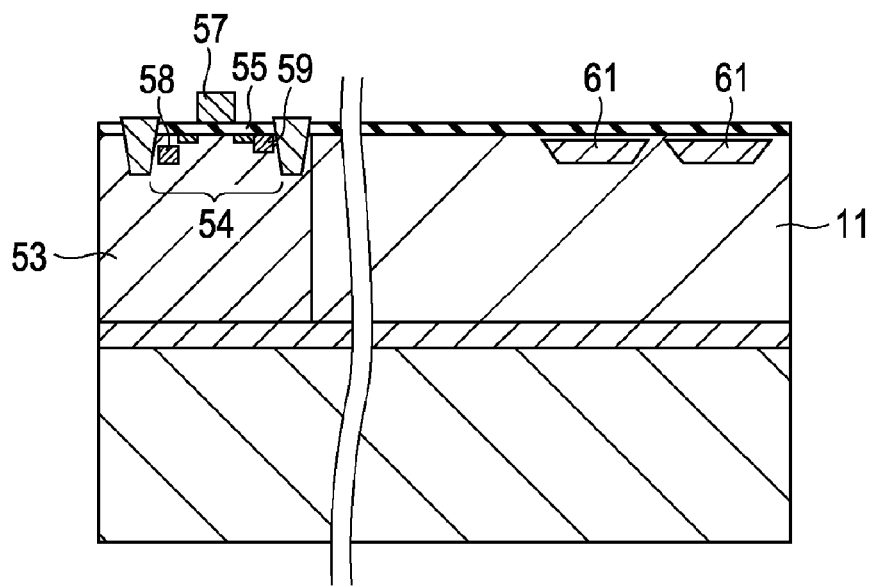

As shown in FIG. 15B, a silicon oxide film is formed on the first substrate 11. This silicon oxide film is formed of, for example, a SiO$_2$ film having a thickness in the range of 5 to 15 nm formed by thermally oxidizing the surface of the first substrate 11 at a temperature in the range of 1,000° C. to 1,100° C. Next, a photoresist pattern (not shown) is formed on the silicon oxide film, and a P-type well region 53 is formed in the first substrate 11 using the photoresist pattern as a mask. Ion implantation for controlling the threshold of a MOS transistor is also conducted. Subsequently, the silicon oxide film is removed by wet etching with hydrofluoric acid or the like, and a gate insulating film 55 is then formed on the surface of the first substrate 11. This gate insulating film 55 is formed of a silicon oxide film with a thickness in the range of 5 to 15 nm obtained by thermally oxidizing the surface of the first substrate 11 at a temperature in the range of 1,000° C. to 1,100° C. The gate insulating film 55 may be composed of a material of a gate insulating film used for typical MOS transistors.

Next, a gate electrode layer is formed. This gate electrode layer is formed of, for example, a polysilicon layer with a thickness in the range of 100 to 200 nm formed by CVD. Alternatively, when a metal gate electrode is formed, a metal layer may be formed. An etching process is then conducted using a photoresist pattern as a mask to form a gate electrode 57.

Furthermore, light-sensing portions 61 are formed in the first substrate 11 by ion implantation using a photoresist pattern as a mask. The photoresist pattern is then removed. Subsequently, source/drain regions 58 and 59 including an LDD region and a high-concentration diffusion layer are formed by ion implantation using a photoresist pattern as a mask in a self-aligning manner with respect to the gate electrode 57. A silicide layer (not shown) may be optionally formed on the gate electrode 57 and the source/drain regions 58 and 59. A so-called salicide process, in which a silicide is formed in a self-aligning manner, can be employed for forming this silicide layer. Thus, a MOS transistor 54 is formed.

Figure 16A:
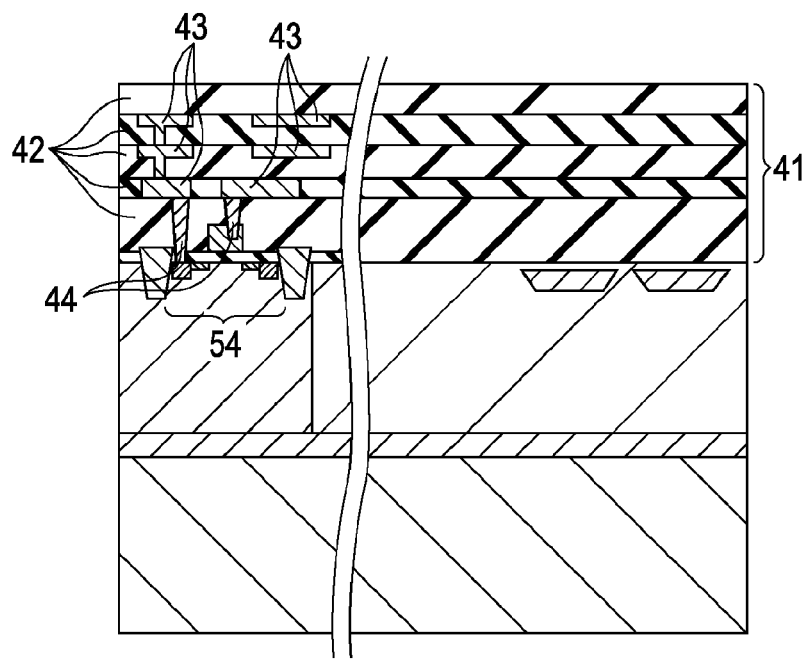
FIGS. 16A and 16B are cross-sectional views each showing a production step of the third example of the method for producing the solid-state imaging device according to the second embodiment of the present invention.

Next, as shown in FIG. 16A, a wiring portion 41 is formed on the first substrate 11. The wiring portion 41 includes a plurality of interlayer insulating films 42 covering the MOS transistor 54, and wiring patterns 43 (including contact electrodes 44) connected to the MOS transistor 54 and the like. For example, an interlayer insulating film 42 covering the gate electrode 57 is formed by depositing a silicon oxide (SiO$_2$) film by, for example, CVD, and the surface of the silicon oxide (SiO$_2$) film is planarized by CMP. Contact electrodes 44 for the source/drain regions 58 and 59 and the gate electrode 57 are formed. The contact electrodes 44 are formed as follows: A barrier metal layer in which a titanium (Ti) layer and a titanium nitride (TiN) layer are stacked is formed in openings serving as electrode-forming regions, and the openings are then each filled with a tungsten layer. Excess portions are then removed by CMP or etch-back. As a result, the contact electrodes 44 formed of a tungsten layer are formed in the openings with the barrier metal layer therebetween. Furthermore, an interlayer insulating film 42 is stacked thereon, openings are formed, and a barrier metal layer and a plated copper wiring layer are formed. A planarizing step by CMP is then performed to form a wiring pattern 43. The formation of an interlayer insulating film 42 and the formation of the wiring pattern 43 described above are repeated to form the wiring portion 41 including a plurality of layers of the wiring pattern 43.

Figure 16B:
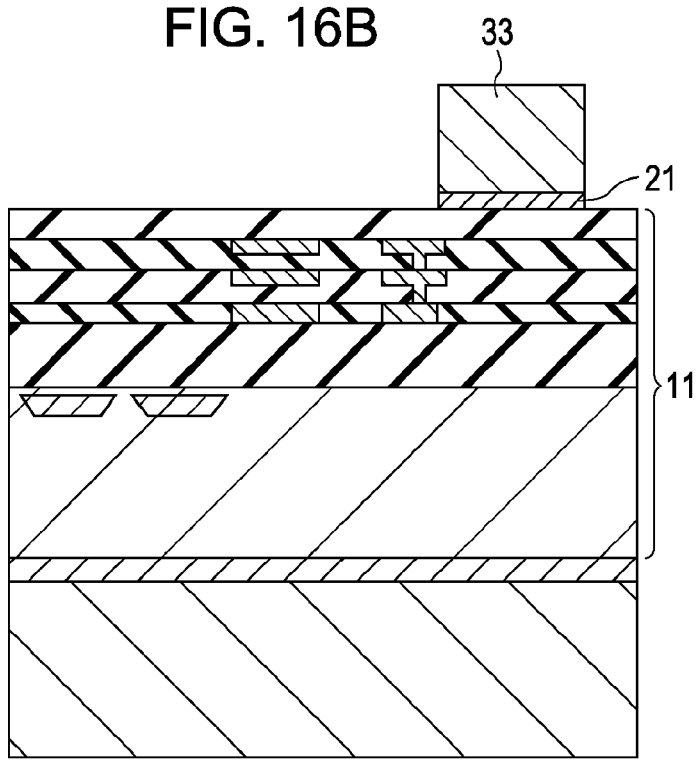

Next, as shown in FIG. 16B, a front-surface-side electrode 21 is formed on the first substrate 11. The front-surface-side electrode 21 is composed of, for example, aluminum. Although not shown in the figure, aluminum wiring connected to the front-surface-side electrode 21 may also be formed in this step. Subsequently, a stopper electrode 33 is formed on front-surface-side electrode 21. The stopper electrode 33 functions as a stopper when a through-hole is formed in a third substrate 37 by energy beam processing. The stopper electrode 33 is selectively formed on the front-surface-side electrode 21 by, for example, nickel plating such as nickel-phosphorus (Ni—P) plating or nickel-boron (Ni—B) plating. The layer disposed under the front-surface-side electrode 21 is covered with a silicon oxide (SiO$_2$) film, which is composed of an inorganic material, and therefore, the underlayer is not degraded even after the plating step is performed. The thickness of the stopper electrode 33 is, for example, 10 μm. The thickness of the stopper electrode 33 is determined so that the stopper electrode 33 satisfactorily functions as a stopper in a subsequent step of energy beam processing, for example, laser drilling.

Figure 17A:
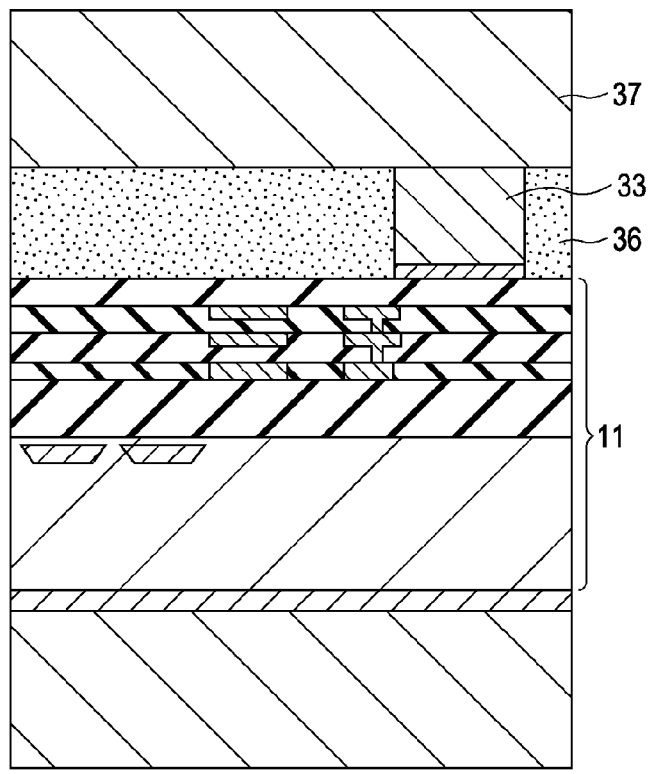
FIGS. 17A and 17B are cross-sectional views each showing a production step of the third example of the method for producing the solid-state imaging device according to the second embodiment of the present invention.

As shown in FIG. 17A, a third substrate 37 is bonded onto the stopper electrode 33 side of the first substrate 11 with an adhesive layer 36 therebetween. The adhesive layer 36 is composed of, for example, benzocyclobutene (BCB), which has a property that a crosslinking reaction (curing) proceeds at a low temperature in the range of 150° C. to 250° C.

Figure 17B:
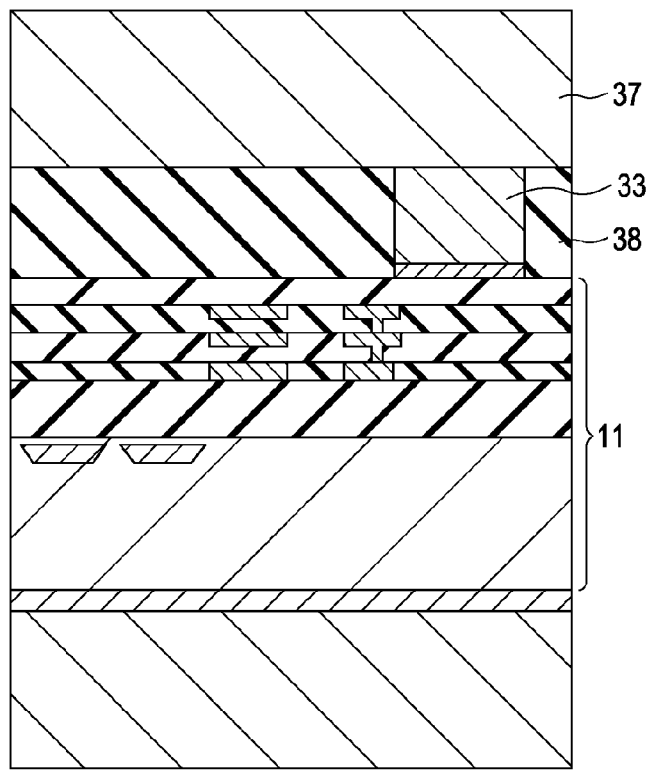

Alternatively, as shown in FIG. 17B, a planarizing film 38 is formed on the first substrate 11, and planarization is performed so that the difference in the level between the surface of the planarizing film 38 and the surface of the stopper electrode 33 is eliminated. The planarizing film 38 is formed by depositing a silicon oxide (SiO$_2$) layer by low-temperature CVD and then planarizing the silicon oxide (SiO$_2$) layer by CMP or etch-back. Subsequently, the planarizing film 38 disposed on the first substrate 11 side is bonded to a third substrate 37, a heat treatment is then performed at a temperature in the range of 200° C. to 400° C., thus bonding the third substrate 37. In this case, the bonding is performed by direct bonding using a hydrogen bond or the like without using the adhesive layer 35.

Figure 18A:
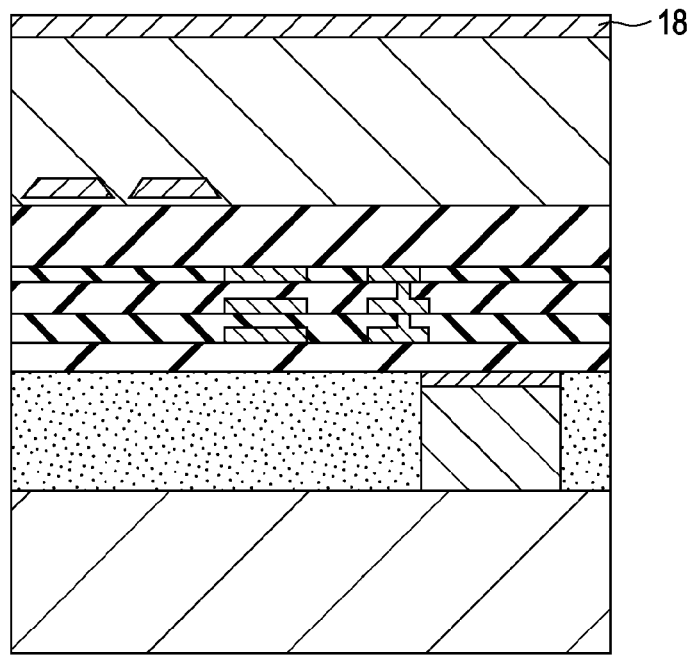
FIGS. 18A and 18B are cross-sectional views each showing a production step of the third example of the method for producing the solid-state imaging device according to the second embodiment of the present invention.

As shown in FIG. 18A, the supporting substrate 25 (refer to FIG. 15A) is removed. For example, the thickness of the supporting substrate 25 is reduced by back grinding and CMP or wet etching so that the supporting substrate 25 becomes a thin film. In this step, the etching is selectively stopped by the stopper layer 18 having a thickness of 20 to 100 nm.

Figure 18B:
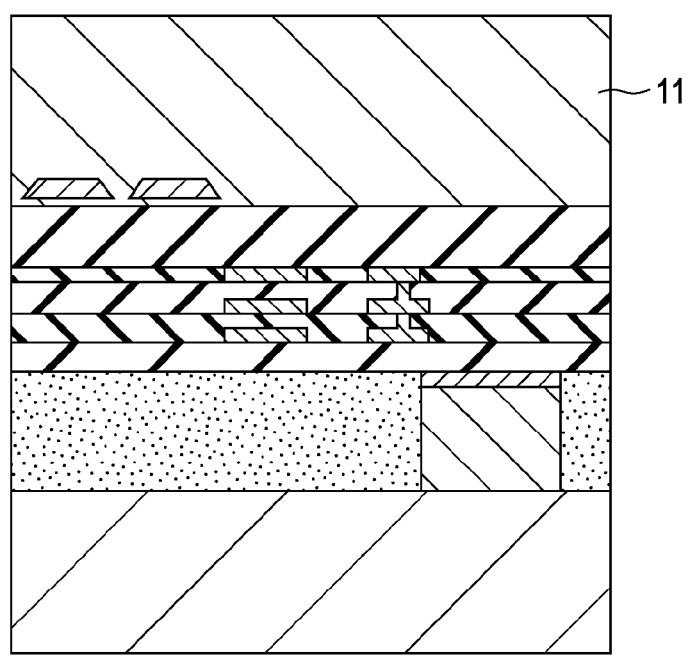

As shown in FIG. 18B, the stopper layer 18 (refer to FIG. 18A) is removed by etching to expose the first substrate 11.

Figure 19A:
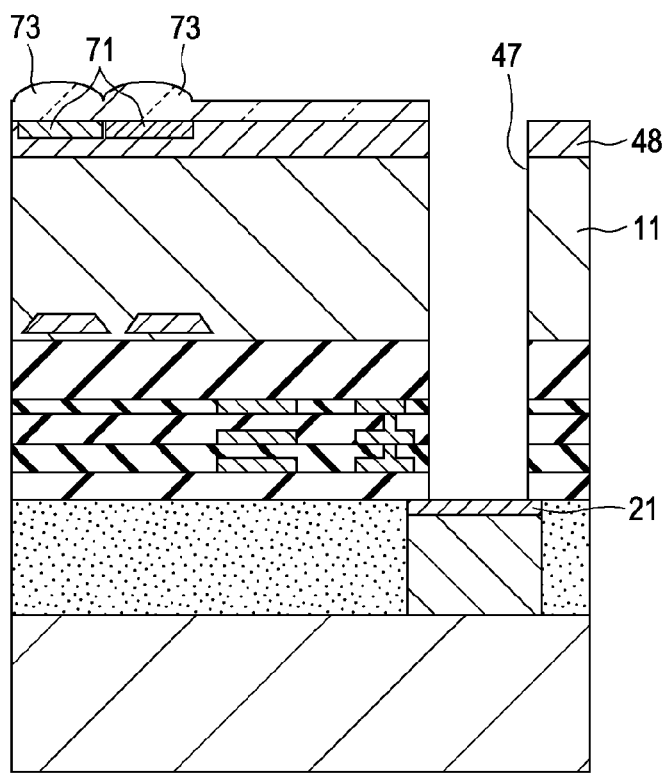
FIGS. 19A and 19B are cross-sectional views each showing a production step of the third example of the method for producing the solid-state imaging device according to the second embodiment of the present invention.

As shown in FIG. 19A, a planarizing film 48 is formed on the back surface side of the first substrate 11. This planarizing film 48 is formed of, for example, an organic film. Subsequently, a color filter layer 71 is formed on the planarizing film 48 by, for example, steps of application, exposure, development, and the like. In the step of application of the color filter layer 71, the color filter layer 71 can be formed without causing uneven application, which adversely affects imaging characteristics of the solid-state imaging device, because the color filter layer 71 is formed on the planarizing film 48.

Next, microlenses 73 are formed on the color filter layer 71. The method for forming the microlenses 73 is the same as that used in the first example.

Next, an opening 47 extending to the front-surface-side electrode 21 is formed in the first substrate 11 by etching using a photoresist pattern as a mask. Subsequently, an insulating film (not shown) is formed on the sidewall of the opening 47. Since a semiconductor substrate is exposed to the sidewall of the opening 47, it is necessary to perform this step of forming the insulating film. However, when the opening 47 is electrically isolated in the step of forming the element isolation regions, the step of forming the insulating film is not necessary.

Figure 19B:
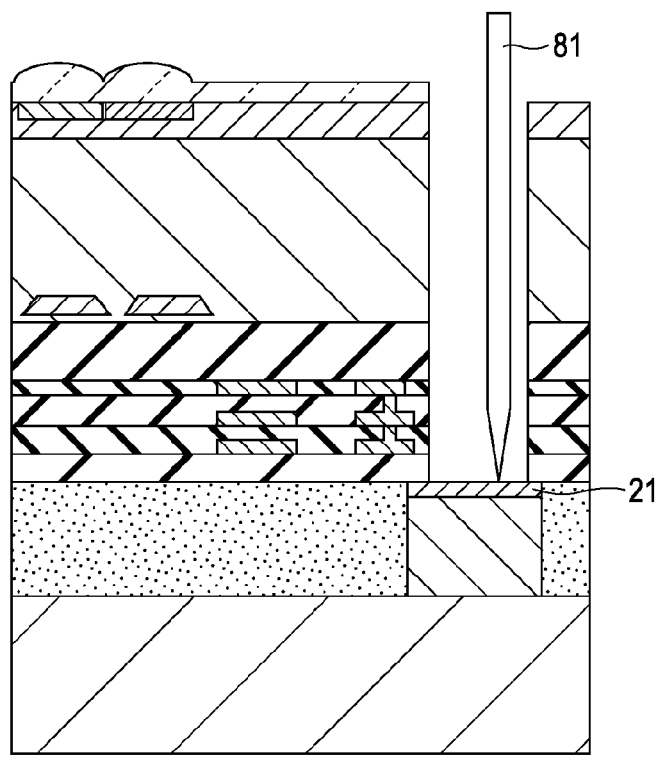

Next, as shown in FIG. 19B, a prober 81 is brought into contact with the front-surface-side electrode 21 to perform a step of measuring imaging characteristics and the like.

Figure 20A:
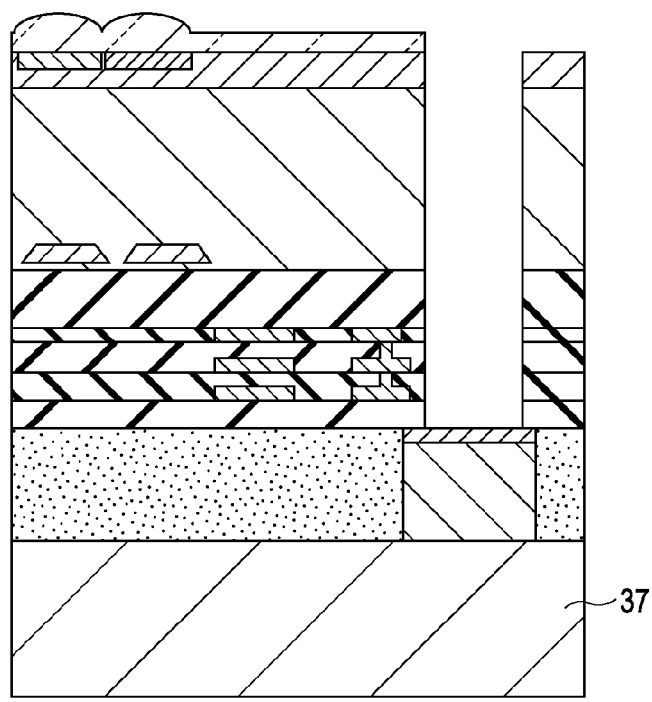
FIGS. 20A and 20B are cross-sectional views each showing a production step of the third example of the method for producing the solid-state imaging device according to the second embodiment of the present invention.

If necessary, as shown in FIG. 20A, the third substrate 37 is processed so as to have a thickness in the range of 100 to 400 μm by performing a back-grinding step.

Figure 20B:
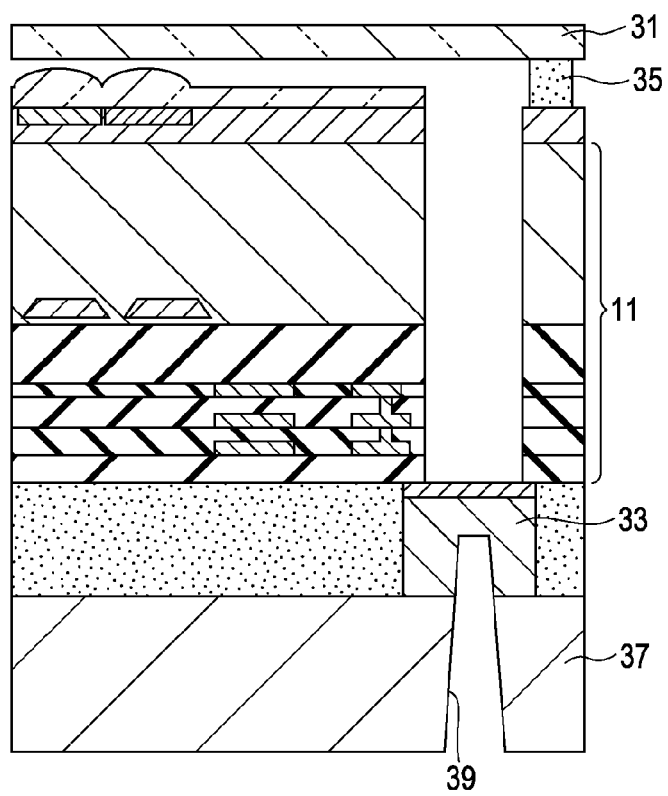

As shown in FIG. 20B, an optically transparent second substrate 31 is bonded to the first substrate 11 at a certain distance, with an adhesive layer 35 therebetween. This second substrate 31 is, for example, a glass substrate.

In this example, the step of bonding the second substrate 31 is performed after the back-grinding step. However, the order of the steps may be reversed. Specifically, the back-grinding step may be performed after the step of bonding the second substrate 31.

Next, a through-hole 39 extending to the stopper electrode 33 is formed in the third substrate 37. Energy beam processing is used in the formation of the through-hole 39. For example, laser drilling is used. For example, a carbon dioxide gas laser processing machine or a laser processing machine using a wavelength of 355 nm of the third harmonic of a YAG laser is used. By using an ablation effect, silicon can be directly vaporized without melting. For example, as for a through-hole 39 having a depth of 100 μm and a diameter of 30 μm, an opening of the through-hole 39 can be formed at a rate of 100,000 holes/min. When it is supposed that the number of openings per chip of a solid-state imaging device is 100, and the number of chips obtained from one wafer with a diameter of 300 mm is 2,000, the opening process of the one wafer is completed within about two minutes. Thus, an operation can be performed in a short time at a low cost, as compared with an existing method for forming openings using exposure and etching.

Figure 21:
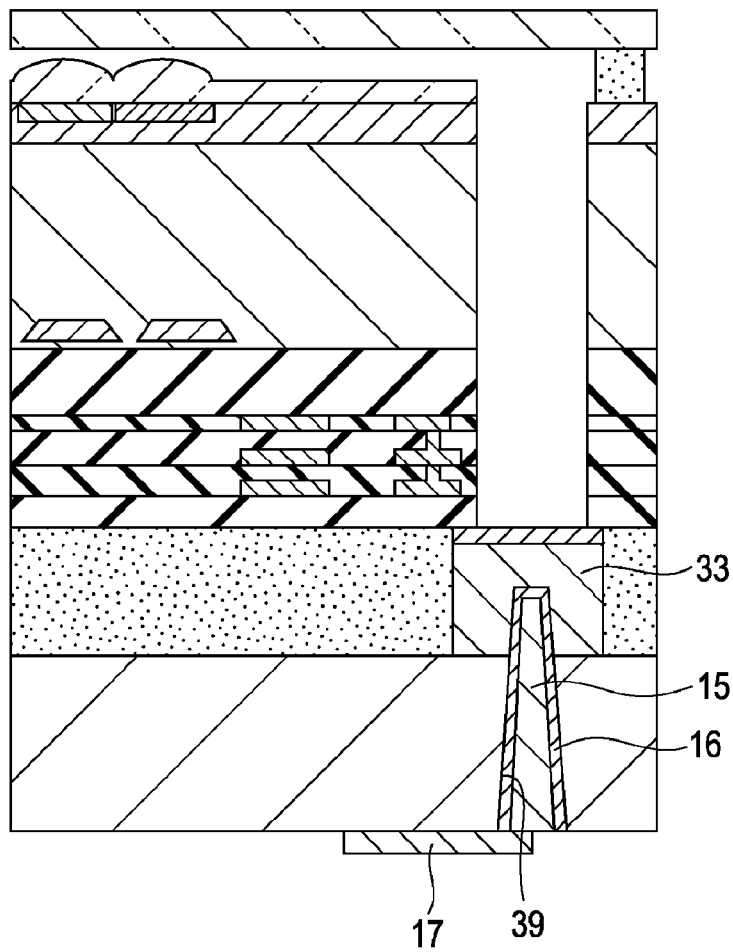
FIG. 21 is a cross-sectional view showing a production step of the third example of the method for producing the solid-state imaging device according to the second embodiment of the present invention.
Figure 22:
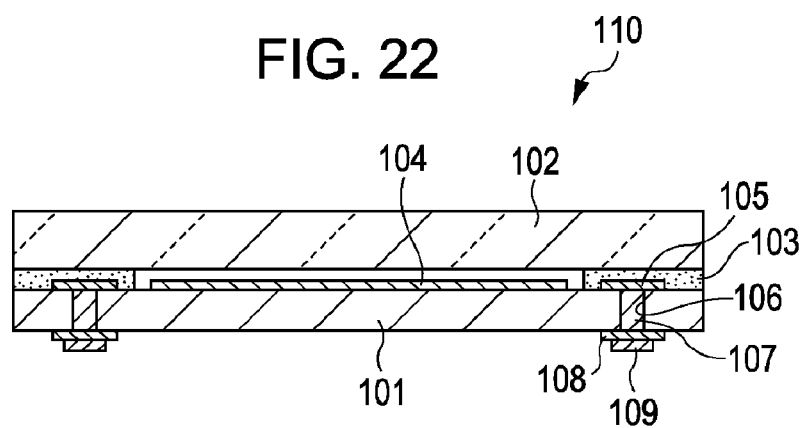
FIG. 22 is a schematic cross-sectional view showing an example of the structure of a solid-state imaging device in the related art.
Figure 23A:
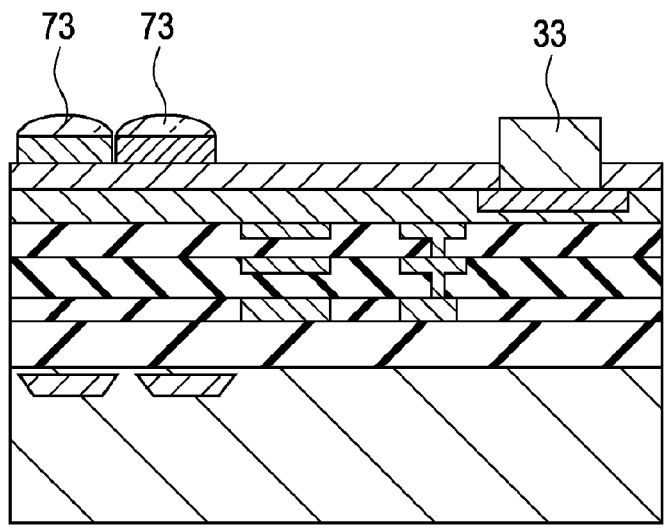
FIGS. 23A and 23B are schematic cross-sectional views each illustrating a problem in the related art.
Figure 23B:
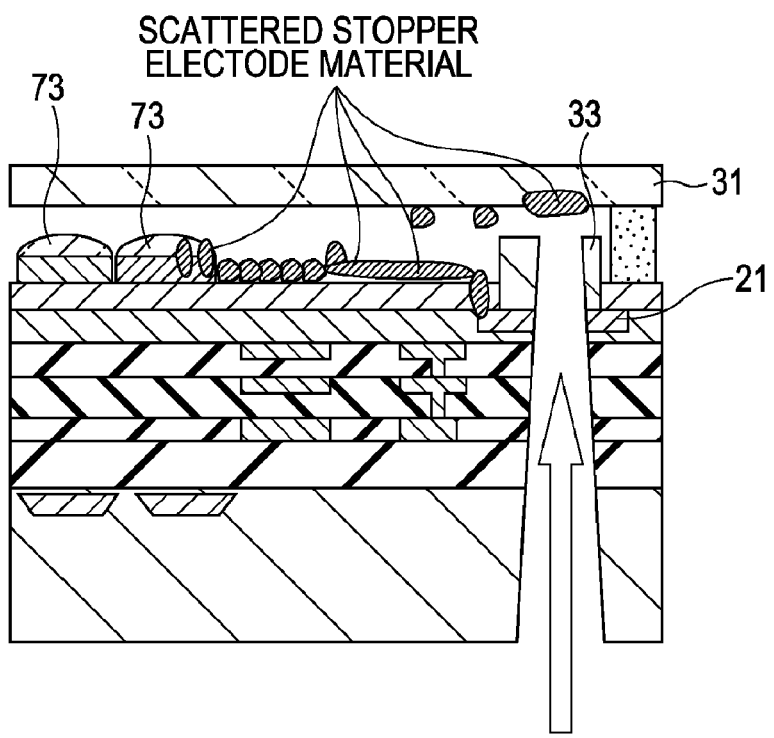

As shown in FIG. 21, a through-via 15 connected to the stopper electrode 33 is formed in the through-hole 39. Furthermore, a back-surface-side electrode 17 connected to the through-via 15 is formed on the back surface of the third substrate 37. These steps are performed as follows. For example, after the formation of the through-hole 39, a silicon oxide ($SiO_2$) film (not shown) is formed in the through-hole 39 so as to be electrically insulated from the silicon substrate. The silicon oxide film located at the bottom of the through-hole 39 is removed, and a stacked film of Ti/TiN is then formed as a barrier metal 16 by sputtering. Subsequently, a seed layer (electroless copper) for an electrode may be optionally formed in advance on the upper layer of the barrier metal 16. Copper plating is then performed. Note that the copper plating may be formed only on the inner wall of the through-hole 39 instead of filling the through-hole 39 with the copper plating.

The solid-state imaging device is produced as described above.

According to the method for producing a solid-state imaging device of the third example, the color filter layer 71 and the microlenses 73 can be easily formed, and the through-hole 39, in which the through-via 15 is to be formed, can be formed in the third substrate 37 of the solid-state imaging device by energy beam processing. Accordingly, it is possible to provide a method for producing a compact solid-state imaging device that can be mass-produced with a high yield at a low cost.

The present application contains subject matter related to that disclosed in Japanese Priority Patent Application JP 2009-177562 filed in the Japan Patent Office on Jul. 30, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
 a first substrate including a light-sensing portion configured to perform photoelectric conversion of incident light and a wiring portion, the first substrate having oppositely facing front and back sides, the front side being a light incident side via which light enters the first substrate, the wiring portion being between the light-sensing portion and the front side;
 an optically transparent second substrate provided over the front side of the first substrate with a space between them;
 a through-hole provided in the first substrate;
 a through-via provided in the through-hole;
 a front-surface-side electrode provided on the front side of the first substrate and connected to the through-via in the through-hole, the through-hole extending to the front-surface-side electrode;
 a back-surface-side electrode connected to the through-via and provided on the back side of the first substrate; and
 a stopper electrode provided on the front-surface-side electrode and configured to function as a stopper when the through-hole is formed in the first substrate using energy beam processing, the stopper electrode filling a space between the front-surface-side electrode and the second substrate and a space between the through-via and the second substrate.

2. The solid-state imaging device according to claim 1, further comprising:
 a color filter layer;
 a microlens, the color filter layer and the microlens being on the front side of the first substrate; and
 an optically transparent protective layer covering the microlens.

3. The solid-state imaging device of claim 1, wherein the energy beam processing is laser drilling.

4. The solid-state imaging device of claim 1, wherein a thickness of the stopper electrode is such that the stopper electrode functions as the stopper when the through-hole is formed in the first substrate using the energy beam processing.

5. The solid-state imaging device of claim 1, wherein the stopper electrode has a given thickness for a certain intensity of the energy beam processing.

* * * * *